(12) United States Patent
Kasai et al.

(10) Patent No.: US 9,363,608 B2
(45) Date of Patent: *Jun. 7, 2016

(54) ACOUSTIC TRANSDUCER

(71) Applicants: Omron Corporation, Kyoto-shi (JP); STMicroelectronics S.r.l., Agrate Brianza (IT)

(72) Inventors: Takashi Kasai, Kustasu (JP); Shobu Sato, Ikoma (JP); Yuki Uchida, Otsu (JP); Igino Padovani, Novate Milanese (IT); Filippo David, Milan (IT); Sebastiano Conti, Mistretta (IT)

(73) Assignees: OMRON CORPORATION, Kyoto-Shi (JP); STMICROELECTRONICS S.R.L., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 13/936,104

(22) Filed: Jul. 5, 2013

(65) Prior Publication Data

US 2013/0294622 A1  Nov. 7, 2013

Related U.S. Application Data

(63) Continuation-in-part of application No. PCT/JP2011/079843, filed on Dec. 22, 2011.

(30) Foreign Application Priority Data

Jan. 7, 2011   (JP) .................. 2011-002313

(51) Int. Cl.
*H04R 19/04* (2006.01)
*H04R 3/00* (2006.01)
(Continued)

(52) U.S. Cl.
CPC .............. *H04R 19/04* (2013.01); *B81B 3/0021* (2013.01); *H04R 3/00* (2013.01); *H04R 3/005* (2013.01);
(Continued)

(58) Field of Classification Search
CPC .... H04R 3/005; H04R 19/005; H04R 19/016; H04R 19/04; H04R 2201/003; B81B 3/0021
USPC ......... 381/162, 369, 174, 176, 191, 182, 184, 381/186; 181/157, 163, 164, 165, 173; 73/718, 724
See application file for complete search history.

(56) References Cited

U.S. PATENT DOCUMENTS 3,588,382 A    6/1971   Reedyk
3,875,349 A    4/1975   Ruegg
(Continued)

FOREIGN PATENT DOCUMENTS

EP   1385324 A1   1/2004
FR   2884101 A1   10/2006
(Continued)

OTHER PUBLICATIONS

Office Action dated Sep. 2, 2014, for corresponding Japanese Application No. 2011-002313, with partial English Translation, 5 pages.
(Continued)

*Primary Examiner* — Curtis Kuntz
*Assistant Examiner* — Joshua Kaufman
(74) *Attorney, Agent, or Firm* — Seed Intellectual Property Law Group, PLLC

(57) ABSTRACT

Provided is an acoustic transducer including: a semiconductor substrate; a vibrating membrane provided above the semiconductor substrate, including a vibrating electrode; and a fixed membrane provided above the semiconductor substrate, including a fixed electrode, the acoustic transducer detecting a sound wave according to changes in capacitances between the vibrating electrode and the fixed electrode, converting the sound wave into electrical signals, and outputting the electrical signals. At least one of the vibrating electrode and the fixed electrode is divided into a plurality of divided electrodes, and the plurality of divided electrodes outputting the electrical signals.

19 Claims, 21 Drawing Sheets

(51) Int. Cl.
| | |
|---|---|
| *H04R 19/00* | (2006.01) |
| *H04R 19/01* | (2006.01) |
| *H04R 31/00* | (2006.01) |
| *B81B 3/00* | (2006.01) |
| *H04R 1/08* | (2006.01) |

(52) U.S. Cl.
CPC ............ *H04R 19/005* (2013.01); *H04R 19/016* (2013.01); *H04R 31/00* (2013.01); *H04R 1/086* (2013.01); *H04R 2201/003* (2013.01)

(56) References Cited

U.S. PATENT DOCUMENTS

| | | | |
|---|---|---|---|
| 4,776,019 A * | 10/1988 | Miyatake | G01D 5/2417 181/158 |
| 4,887,300 A | 12/1989 | Erling | |
| 5,388,163 A | 2/1995 | Elko et al. | |
| 5,452,268 A | 9/1995 | Bernstein | |
| 5,517,683 A | 5/1996 | Collett et al. | |
| 5,886,656 A | 3/1999 | Feste et al. | |
| 5,982,709 A * | 11/1999 | Ladabaum et al. | 367/170 |
| 6,101,258 A | 8/2000 | Killion et al. | |
| 6,271,780 B1 | 8/2001 | Gong et al. | |
| 6,449,593 B1 | 9/2002 | Valve | |
| 6,535,460 B2 | 3/2003 | Loeppert et al. | |
| 6,640,643 B2 | 11/2003 | Ishio et al. | |
| 6,731,767 B1 | 5/2004 | Blamey et al. | |
| 6,873,709 B2 | 3/2005 | Hou | |
| 6,882,734 B2 | 4/2005 | Watson et al. | |
| 6,944,474 B2 | 9/2005 | Rader et al. | |
| 6,950,528 B2 | 9/2005 | Fischer | |
| 7,003,127 B1 | 2/2006 | Sjursen et al. | |
| 7,016,508 B1 | 3/2006 | Phelps | |
| 7,146,016 B2 * | 12/2006 | Pedersen | 381/175 |
| 7,170,847 B2 | 1/2007 | De Jong et al. | |
| 7,181,030 B2 | 2/2007 | Rasmussen et al. | |
| 7,346,178 B2 * | 3/2008 | Zhe et al. | 381/174 |
| 7,359,504 B1 | 4/2008 | Reuss et al. | |
| 7,362,873 B2 * | 4/2008 | Pedersen | 381/175 |
| 7,539,613 B2 | 5/2009 | Takada | |
| 7,578,196 B2 | 8/2009 | Riccoti et al. | |
| 7,676,052 B1 | 3/2010 | Ma et al. | |
| 7,756,282 B2 | 7/2010 | Rass et al. | |
| 7,804,969 B2 * | 9/2010 | Wang et al. | 381/174 |
| 7,805,821 B2 | 10/2010 | Suzuki | |
| 7,813,517 B2 | 10/2010 | Klemenz et al. | |
| 7,825,483 B2 | 11/2010 | Nakatani et al. | |
| 7,836,770 B2 | 11/2010 | Goldberg et al. | |
| 7,856,283 B2 | 12/2010 | Burk et al. | |
| 7,856,804 B2 | 12/2010 | Laming et al. | |
| 7,888,840 B2 * | 2/2011 | Shimaoka et al. | 310/309 |
| 7,907,744 B2 | 3/2011 | Kasai et al. | |
| 8,045,733 B2 * | 10/2011 | Zhe et al. | 381/174 |
| 8,045,734 B2 * | 10/2011 | Zhe et al. | 381/175 |
| 8,072,010 B2 * | 12/2011 | Lutz | 257/254 |
| 8,150,084 B2 | 4/2012 | Jessen et al. | |
| 8,175,293 B2 | 5/2012 | Suvanto | |
| 8,194,881 B2 | 6/2012 | Haulick et al. | |
| 8,223,981 B2 | 7/2012 | Haila et al. | |
| 8,233,637 B2 | 7/2012 | Phelps et al. | |
| 8,243,962 B2 | 8/2012 | Qiao | |
| 8,270,634 B2 | 9/2012 | Harney et al. | |
| 8,284,958 B2 | 10/2012 | Suvanto et al. | |
| 8,327,711 B2 | 12/2012 | Kasai et al. | |
| 8,351,625 B2 * | 1/2013 | Kasai | 381/175 |
| 8,433,084 B2 | 4/2013 | Conti et al. | |
| 8,477,983 B2 | 7/2013 | Weigold et al. | |
| 8,644,528 B2 * | 2/2014 | Mehregany | 381/174 |
| 8,934,649 B1 * | 1/2015 | Lee et al. | 381/174 |
| 8,942,394 B2 * | 1/2015 | Conti et al. | 381/174 |
| 2002/0057815 A1 | 5/2002 | Killion | |
| 2002/0067663 A1 * | 6/2002 | Loeppert et al. | 367/181 |
| 2003/0015040 A1 * | 1/2003 | Ishio et al. | 73/718 |
| 2003/0133588 A1 * | 7/2003 | Pedersen | 381/423 |
| 2003/0210799 A1 | 11/2003 | Gabriel et al. | |
| 2006/0093170 A1 * | 5/2006 | Zhe et al. | 381/191 |
| 2007/0041597 A1 * | 2/2007 | Song | 381/175 |
| 2007/0047746 A1 * | 3/2007 | Weigold et al. | 381/174 |
| 2007/0121972 A1 | 5/2007 | Suzuki et al. | |
| 2007/0201710 A1 | 8/2007 | Suzuki et al. | |
| 2007/0222006 A1 | 9/2007 | Weber et al. | |
| 2008/0123878 A1 * | 5/2008 | Zhe et al. | 381/191 |
| 2008/0175399 A1 | 7/2008 | Kim et al. | |
| 2008/0192962 A1 | 8/2008 | Halteren | |
| 2008/0192963 A1 | 8/2008 | Sato | |
| 2008/0205668 A1 | 8/2008 | Torii et al. | |
| 2009/0002498 A1 | 1/2009 | Oku | |
| 2009/0095081 A1 | 4/2009 | Nakatani | |
| 2009/0208037 A1 * | 8/2009 | Zhe | 381/174 |
| 2010/0117485 A1 | 5/2010 | Martin et al. | |
| 2010/0158280 A1 * | 6/2010 | Coronato et al. | 381/174 |
| 2010/0254560 A1 | 10/2010 | Mehregany | |
| 2011/0140213 A1 | 6/2011 | Kasia et al. | |
| 2012/0093333 A1 | 4/2012 | Hu et al. | |
| 2012/0269363 A1 | 10/2012 | Suvanto | |
| 2013/0070942 A1 | 3/2013 | Kasai et al. | |
| 2013/0208923 A1 | 8/2013 | Suvanto | |
| 2014/0010374 A1 * | 1/2014 | Kasai et al. | 381/26 |
| 2014/0191343 A1 * | 7/2014 | Kasai et al. | 257/416 |

FOREIGN PATENT DOCUMENTS

| | | |
|---|---|---|
| JP | 62-213400 A | 9/1987 |
| JP | 03-139097 A | 6/1991 |
| JP | 10-126886 A | 5/1998 |
| JP | 2005-110204 A | 4/2005 |
| JP | 2006-101302 A | 4/2006 |
| JP | 2008-005439 A | 1/2008 |
| JP | 2009-081624 A | 4/2009 |
| JP | 2009-098022 A | 5/2009 |
| JP | 2009-124474 A | 6/2009 |
| JP | 4419103 B1 | 2/2010 |
| JP | 2011-4129 A | 1/2011 |
| SU | 1582361 A1 | 7/1990 |
| SU | 1670807 A1 | 8/1991 |
| WO | 2006/007441 A1 | 1/2006 |

OTHER PUBLICATIONS

Kasai et al., *Novel Concept for a Mems Microphone With Dual Channels for an Ultrawide Dynamic Range*, MEMS 2011, Cancun, Mexico, Jan. 23-27, 2011, pp. 605-608.
Kasai et al., *Small Silicon Condenser Microphone Improved With a Backchamber With Concave Lateral Sides*, Digest Tech. Papers Transducers 2007 Conference, pp. 2613-2616.
Leinenbach et al., *A New Capacitive Type MEMS Microphone*, Proc. MEMS 2010, pp. 659-662.
Scheeper et al., *A Review of Silicon Microphones*, Sensors and Actuators A 44, 1994, pp. 1-11.
Weigold et al., *A MEMS Condenser Microphone for Consumer Applications*, MEMS 2006, Istanbul, Turkey, Jan. 22-26, 2006, pp. 86-89.
Chinese Office Action dated May 27, 2015, for corresponding CN Application No. 201180064105.8, 6 pages.
English Translation of Chinese Office Action dated May 27, 2015, for corresponding CN Application No. 201180064105.8, 10 pages.

* cited by examiner

ACOUSTIC TRANSDUCER

BACKGROUND

1. Technical Field

The present disclosure relates to an acoustic transducer that converts a sound wave into electrical signals, and to a microphone including the acoustic transducer. In particular, the present disclosure relates to an acoustic transducer having a split membrane.

2. Description of the Related Art

Conventionally, an ECM (Electret Condenser Microphone) has been widely used as a miniature microphone mounted on a cellular (mobile) phone and the like. However, the ECM is weak against heat. On the other hand, a MEMS microphone is superior to the ECM in terms of digitalization, miniaturization, enhancement of functionality/multi-functionality, and power savings. Accordingly, at present, the MEMS microphone is becoming widespread.

The MEMS microphone includes a capacitor-type acoustic sensor (acoustic transducer) that detects a sound wave and converts the detected sound wave into an electrical signal (detection signal), a drive circuit that applies a voltage to the acoustic sensor, and a signal processing circuit that performs signal processing such as amplification on the detection signal from the acoustic sensor and outputs the processed detection signal to the outside. The acoustic sensor is manufactured by using MEMS technology. The drive circuit and the signal processing circuit are manufactured integrally with each other as an ASIC (Application Specific Integrated Circuit) by using a semiconductor manufacturing technology.

Currently, a microphone can detect and output a large sound with high quality. In general, a maximum input sound pressure (dynamic range) is restricted by a total harmonic distortion (hereinafter, referred to as "THD"). This is because attempting to detect a large sound by the microphone results in generation of a harmonic distortion in an output signal, thereby leading to deterioration of sound quality. Namely, if the THD can be reduced, then the maximum input sound pressure can be increased.

However, in a general microphone, detection sensitivity for the sound wave and the THD have a trade-off relationship therebetween. Therefore, a high-sensitivity microphone has a large THD, so as to have a small maximum input sound pressure. This is because the high-sensitivity microphone tends to output a large signal and therefore is likely to cause the THD. Meanwhile, a low-sensitivity microphone causes a small THD, so as to have a large maximum input sound pressure. However, it is difficult for the low-sensitivity microphone to detect a small sound with high quality.

In order to cope with these problems, such a microphone which uses a plurality of acoustic sensors having respective different sensitivities has been studied (for example, refer to U.S. Pat. Nos. 8,223,981 and 8,233,637, U.S. Patent Application Publication 2007/0047746 (published on Mar. 1, 2007), and Japanese Unexamined Patent Publication No. 2008-245267 (published on Oct. 9, 2008)).

Each of U.S. Pat. Nos. 8,223,981 and 8,233,637 discloses a microphone including a plurality of acoustic sensors, wherein the plurality of acoustic sensors output a plurality of signals and the plurality of signals are switched or combined in response to a sound pressure. In particular, U.S. Pat. No. 8,223,981 discloses a microphone including a high-sensitivity acoustic sensor whose detectable sound pressure level (SPL) ranges from 20 dB to 110 dB and a low-sensitivity acoustic sensor whose detectable sound pressure level ranges from 50 dB to 140 dB, wherein the microphone uses the high-sensitivity acoustic sensor and the low-sensitivity acoustic sensor in a switching manner so as to achieve a detectable sound pressure level ranging from 20 dB to 140 dB. Moreover, each of Japanese Unexamined Patent Publication No. 2008-245267 and U.S. Patent Application Publication No. 2007/0047746 discloses a configuration including a plurality of acoustic sensors independently provided on a single chip.

However, according to the above configuration described in each of Japanese Unexamined Patent Publication No. 2008-245267 and U.S. Patent Application Publication No. 2007/0047746, the acoustic sensors are formed independently of one another, and therefore variation and mismatching in their acoustic characteristics occurs. Here, the expression "variation in the acoustic characteristics" refers to a difference between the chips with regard to the acoustic characteristics of the acoustic sensor. The expression "mismatching in the acoustic characteristics" refers to a difference between the plurality of acoustic sensors in a single chip with regard to the acoustic characteristics.

Specifically, the acoustic sensors have thin films warped in respective different manners, so that variations in the detection sensitivity occur between the chips independently. As a result, a large variation between the chips occurs in the difference between the detection sensitivities among the acoustic sensors. Further, the acoustic sensors have their respective back chambers and vent holes. Since acoustic characteristics such as frequency characteristics and phases are affected by the back chamber and the vent hole, mismatching in the acoustic characteristics occurs in the chip.

BRIEF SUMMARY

The present embodiment describes an acoustic transducer which is capable of converting a sound wave into a plurality of electrical signals, and is capable of reducing the variations between the chips and the mismatching in the chip with regard to the acoustic characteristics.

In accordance with one aspect, an acoustic transducer includes a substrate; a vibrating membrane, provided above the substrate, includes a vibrating electrode; and a fixed membrane, provided above the substrate, includes a fixed electrode; the acoustic transducer detecting a sound wave according to changes in capacitance between the vibrating electrode and the fixed electrode; converting the sound wave into electrical signals; and outputting the electrical signals, at least one of the vibrating electrode and the fixed electrode being divided into a plurality of divided electrodes and the plurality of divided electrodes outputting the electrical signals.

In accordance with the above configuration, at least one of the vibrating electrode and the fixed electrode is divided into divided electrodes, whereby a plurality of variable capacitors are formed between the vibrating electrode and the fixed electrode. This makes it possible to provide an acoustic transducer in which the plurality of divided electrodes respectively output the plurality of electrical signals, so that the sound wave is converted into the plurality of electrical signals.

Moreover, the plurality of variable capacitors are formed between the same vibrating membrane and the same fixed membrane. Hence, according to the present disclosure, the chips have similar variations between the detection sensitivities of the respective variable capacitors, in comparison with the conventional technique by which the plurality of vibrating membranes and the plurality of fixed membranes are provided independently. This makes it possible to reduce the variation between the chips with regard to the difference between the detection sensitivities of the variable capacitors.

Moreover, the variable capacitors share the vibrating membrane and the fixed membrane. This makes it possible to reduce, in the chip, mismatching in the acoustic characteristics such as the frequency characteristics and the phases.

As described above, according to the acoustic transducer of the present disclosure, at least one of the vibrating electrode and the fixed electrode is divided into a plurality of divided electrodes, whereby the plurality of variable capacitors are formed between the vibrating electrode and the fixed electrode. This makes it possible to provide the acoustic transducer in which the plurality of divided electrodes respectively output a plurality of electrical signals, so that the sound wave is converted into the plurality of electrical signals. Moreover, the plurality of variable capacitors are formed between the same vibrating membrane and the same fixed membrane. This makes it possible to reduce the variation between the chips with regard to the difference between the detection sensitivities of the variable capacitors, and to reduce, in the chip, the mismatching in the acoustic characteristics such as the frequency characteristics and the phases.

DETAILED DESCRIPTION

First Embodiment

Figure 1A:
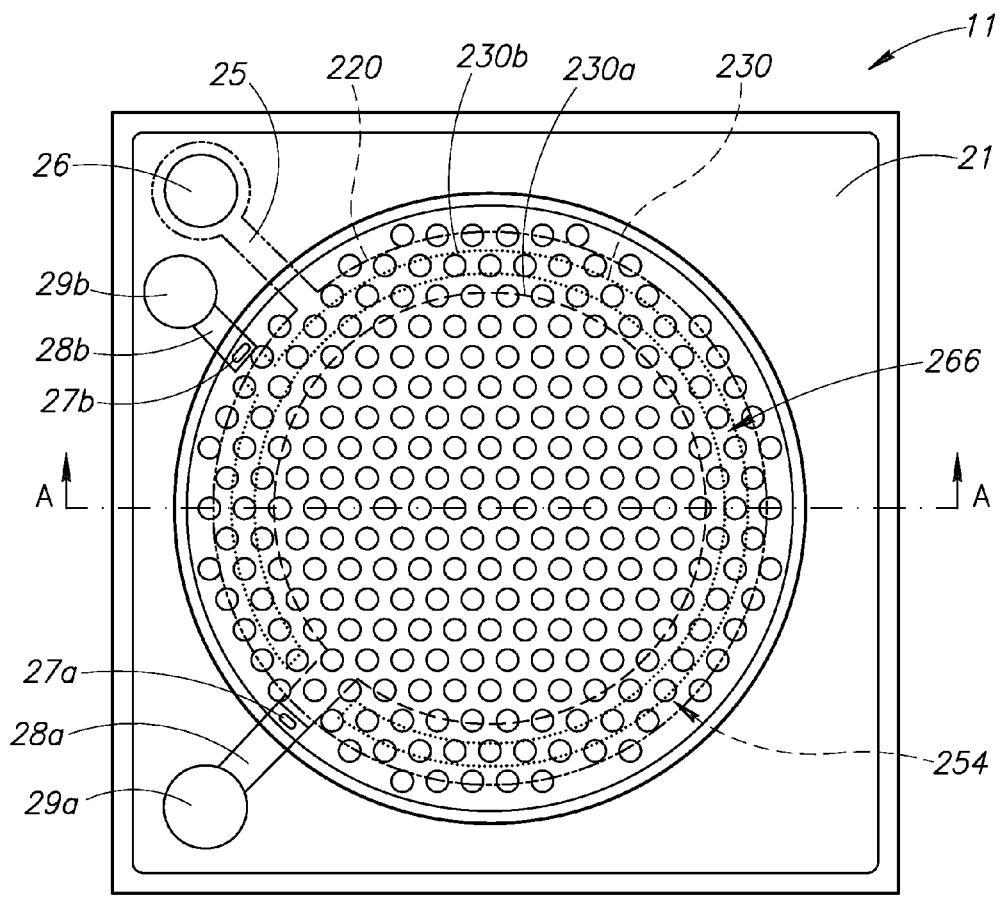
FIGS. 1A and 1B are a plan view and a cross-sectional view, which show a schematic configuration of an acoustic sensor in a MEMS microphone according to an embodiment of the present disclosure.

The following describes an embodiment of the present disclosure with reference to FIGS. 1A to 3. FIGS. 1A and 1B are top down and cross-sectional views of the acoustic sensor 11 in this embodiment. FIG. 1A is a top plan view of the acoustic sensor 11, and FIG. 1B is an enlarged cross-sectional view of the acoustic sensor 11, taken along line A-A shown in FIG. 1A and viewed in an arrow direction shown in FIG. 1A.

Figure 2A:
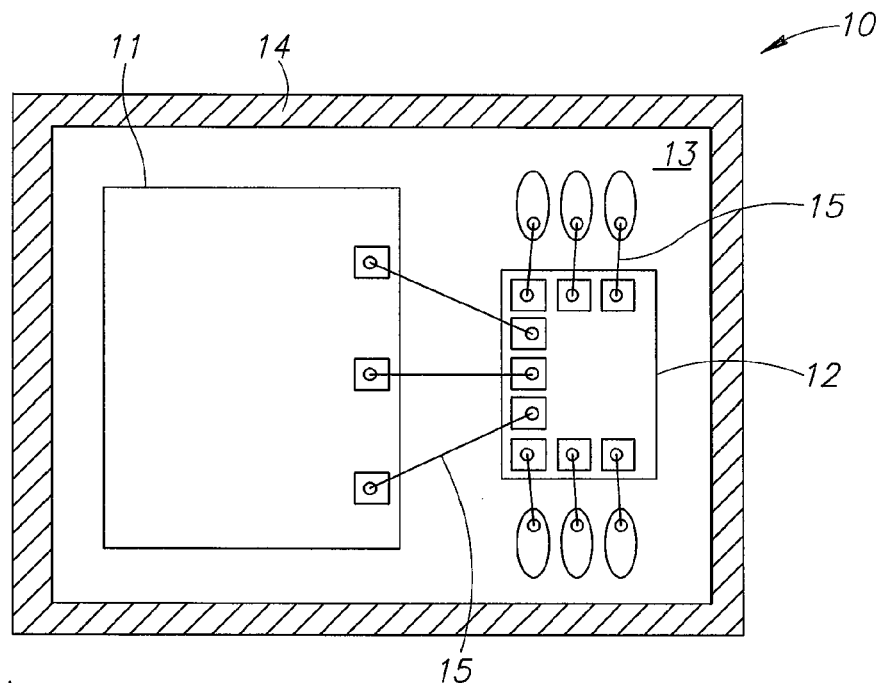
FIGS. 2A to 2C are a plan view and cross-sectional views, which show a schematic configuration of the MEMS microphone.
Figure 2B:
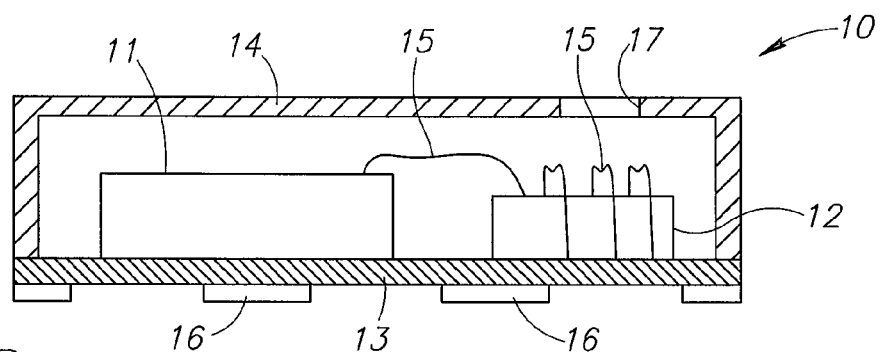
Figure 2C:
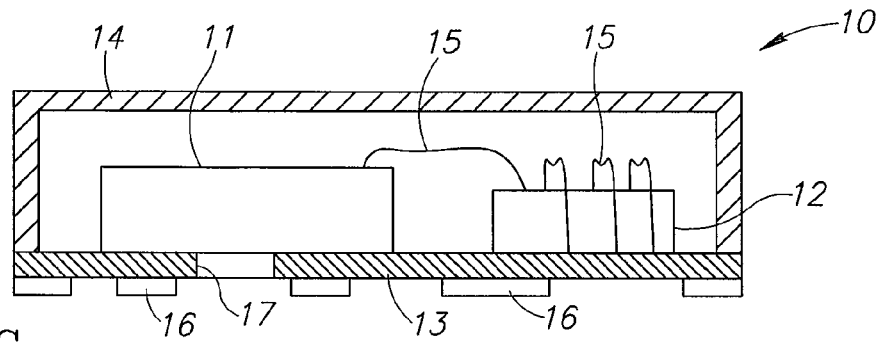

FIGS. 2A to 2C show a schematic configuration of a MEMS microphone package of this embodiment. FIG. 2A is a plan view showing a portion of the MEMS microphone package with an upper portion of the package cut away. FIGS. 2B and 2C are front views showing the MEMS microphone packages with a front portions cut away. Note that FIG. 2C is a modification of the configuration shown in FIG. 2B.

As shown in FIG. 2A, the MEMS microphone package 10 includes an acoustic sensor (acoustic transducer) 11, an ASIC 12, a wiring board or printed circuit board 13, and a cover 14.

The acoustic sensor 11 detects a sound wave and converts the sound wave into electrical signals (detection signals). The acoustic sensor 11 is a MEMS chip manufactured using a MEMS technique. The ASIC 12 is an integrated circuit (IC) that has a power supply function to supply power to the acoustic sensor 11 and a signal processing function to appropriately process the electrical signal from the acoustic sensor 11 and output the electrical signal to an external device. The ASIC 12 is a semiconductor chip manufactured using a semiconductor technique. The acoustic sensor 11 and the ASIC 12 are arranged on the wiring board 13, and are covered with the cover 14.

Electrical connection between the wiring board 13, the acoustic sensor 11, and the ASIC 12 is typically made by metal wires 15; however, connection can alternatively be made by gold bump bonding or the like. The wiring board 13 is provided with connection terminals 16 for electrically connecting the wiring board 13 to an external device. The connection terminals 16 on a bottom surface of the wiring board are used to receive power supplied from the outside, to output a signal to the outside, and the like. The wiring board 13 is mounted to a variety of devices, typically by surface reflow soldering, and is electrically connected thereto by the connection terminals 16.

The cover 14 protects the acoustic sensor 11 and the ASIC 12 from noise, physical contact, and other external forces. Therefore, the cover 14 has an electromagnetic shield layer provided on its outer layer or on an inner surface. Moreover, the cover 14 has a through hole 17 through which an external sound wave reaches the acoustic sensor 11. In FIG. 2B, the through hole 17 is provided in an upper side of the cover 14. Alternatively, the through hole 17 may be provided in a lateral side of the cover 14, or may be provided, as shown in FIG. 2C, in a region of the wiring board 13, on which region the acoustic sensor 11 is provided.

Figure 1B:
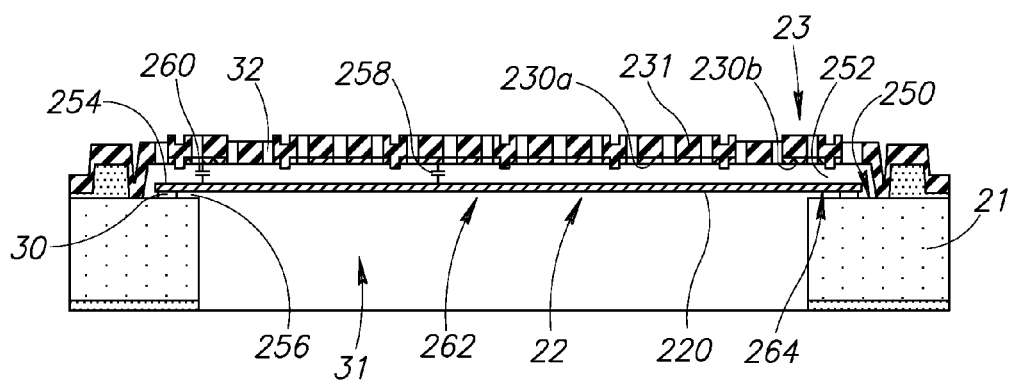

As shown in FIGS. 1A and 1B, the acoustic sensor 11 includes a semiconductor substrate 21 with a vibrating membrane 22 positioned on an upper surface 250 of the semiconductor substrate 21 and, further, a fixed membrane 23 covering the vibrating membrane 22. The vibrating membrane 22 is a conductor, and functions as a vibrating electrode 220. Meanwhile, the fixed membrane 23 includes a first fixed electrode 230a and a second fixed electrode 230b that are conductive, and a protecting membrane 231 that is an insulator for protecting the fixed electrodes 230a, 230b. The vibrating electrode 220 and the fixed electrodes 230a, 230b are facing each other with a gap 252 therebetween, and function as a capacitor.

An edge portion 254 of the vibrating membrane 22 is attached to the upper surface 250 of the semiconductor substrate 21 via an insulating layer 30. The insulating layer 30 is disposed between the edge portion 254 of the vibrating membrane 22 and the semiconductor substrate 21 so that the edge portion 254 of the vibrating membrane 22 and the semiconductor substrate 21 are spaced apart from each other by a distance. This provides a gap (vent hole) 256 between the edge portion of the vibrating membrane 22 and the semiconductor substrate 21.

Moreover, the semiconductor substrate 21 has an opening (back chamber) 31. Furthermore, the fixed membrane 23 has a large number of sound hole portions 32 each forming a sound hole. Typically, the sound hole portions 32 are arranged regularly at equal intervals, and the sound holes of the respective sound hole portions 32 have substantially the same size.

In the configuration of FIG. 2B, a sound wave will pass through the through hole 17 and the sound hole portions 32 of the fixed membrane 23, and will reach the vibrating membrane 22. Moreover, in the case of FIG. 2C, the through hole 17 and the opening 31 of the acoustic sensor 11 are connected to each other, and the sound wave will pass through the through hole 17 and the opening 31, and will reach the vibrating membrane 22. In comparison with the case of FIG. 2B, the configuration of FIG. 2C makes it possible to reduce deteriorations of sensitivity and frequency characteristics occurring due to a volume effect of the opening 31.

In the acoustic sensor 11 having the above configuration, an external sound wave reaches the vibrating membrane 22 through the sound hole portions 32 of the fixed membrane 23 or through the opening 31. At this time, the vibrating membrane 22 vibrates upon application of a sound pressure of the sound wave that has reached the vibrating membrane 22. This changes an interval (air gap) between the vibrating electrode 220 and the fixed electrodes 230a, 230b, thereby changing a capacitance between the vibrating electrode 220 and the fixed electrodes 230a, 230b. By converting the change of the capacitance into a change in a voltage or a current, the acoustic sensor 11 can detect the external sound wave and convert the detected sound wave into electrical signal (detection signal).

The acoustic sensor 11 having the above configuration includes the fixed membrane 23 having the large number of sound hole portions 32. Besides allowing the external sound wave to pass therethrough to reach the vibrating membrane 22, the sound hole portions 32 have the following functions:
(1) The sound hole portions 32 allow the sound wave that has reached the fixed membrane 23 to pass through, so that the sound pressure applied to the fixed membrane 23 is reduced.
(2) The sound hole portions 32 allow the air between the vibrating membrane 22 and the fixed membrane 23 to go in and out through the sound hole portions 32. This results in a reduction in thermal noise (air fluctuations). Moreover, this reduces damping of the vibrating membrane 22, which is caused by the air, thereby reducing deterioration of high frequency characteristics that may be caused by the damping.
(3) The sound hole portions 32 can be used as etching holes for forming the gap between the vibrating electrode 220 and the fixed electrodes 230a, 230b by a surface micromachining technique.

In this embodiment, the semiconductor substrate 21 is a semiconductor, which has a thickness of approximately 400 μm, and is made from monocrystalline silicon or the like. The vibrating membrane 22 is a conductor, which has a thickness of approximately 0.7 μm, and is made from polycrystalline silicon or the like. The vibrating membrane 22 functions as the vibrating electrode 220. The fixed membrane 23 includes the fixed electrodes 230a, 230b and the protecting membrane 231. The fixed electrodes 230a, 230b are conductors, which have a thickness of approximately 0.5 μm, and are made from polycrystalline silicon and the like. The protecting membrane 231 is an insulator, which has a thickness of approximately 2 μm, and is made from silicon nitride or the like. Moreover, the gap 252 between the vibrating electrode 220 and the fixed electrodes 230a, 230b is approximately 4 μm.

In this embodiment, as shown in FIGS. 1A and 1B, the fixed electrodes 230a, 230b are divided into the first electrode 230a provided centrally in the fixed membrane 23, and the peripheral second electrode 230b provided peripherally in the fixed membrane 23. The first electrode 230a and the second electrode 230b are electrically isolated from each other. The first electrode 230a is connected to a connection terminal 29a through a contact portion 27a and a wiring strip 28a. Meanwhile, the second electrode 230b is connected to a connection terminal 29b through a contact portion 27b and a wiring strip 28b. Note that the vibrating electrode 220 is connected to a connection terminal 26 through the wiring strip 25.

Thus, the capacitors made of the vibrating electrode 220 and the fixed electrodes 230a, 230b are divided into (i) a first capacitor 258, which includes the first electrode 230a and a central portion 262 of the vibrating electrode 220, and (ii) a second peripheral capacitor 260, which includes the second electrode 230b and the peripheral portion 264 of the vibrating electrode 220. Thus, the acoustic sensor 11 of this embodiment is capable of converting an external sound wave into an electrical signal from the first capacitor 258 and an electrical signal from the second capacitor 260.

Since, the vibrating membrane 22 is fixed at the edge portions 254, the central portion 262 of the vibrating membrane 22 is displaced a large amount as a result of vibration, and the peripheral portion 264 of the vibrating membrane 22 is displaced a small amount as a result of vibration. Thus, the first capacitor 258 serves as a high-sensitivity capacitor having a high detection sensitivity, and the second capacitor 260 serves as a low-sensitivity capacitor having a low detection sensitivity. Hence, the acoustic sensor 11 of this embodiment is capable of converting an external sound wave into two electrical signals with different detection sensitivities. In this manner, the acoustic sensor 11 of this embodiment achieves an expanded detectable sound pressure level, in comparison with the conventional acoustic sensor including only one variable capacitor. Moreover, the first electrode 230a has a wider area than the second electrode 230b. Accordingly, this makes it possible to expand the detectable sound pressure level.

Moreover, in this embodiment, the fixed electrodes 230a, 230b are divided or otherwise electrically isolated, but the vibrating membrane 22 and the protecting membrane 231 are in a single part. Thus, in comparison with the conventional acoustic sensor including the separate vibrating membrane and the separate protecting membrane, the chips have similar variations between the detection sensitivities of the first capacitor 258 and the second capacitor 260. This makes it possible to reduce variations between the chips with regard to the difference between the detection sensitivities of the first capacitor 258 and the second capacitor 260.

Moreover, the first capacitor 258 and the second capacitor 260 share the vibrating membrane 22 and the protecting membrane 231. This makes it possible to reduce, in the chip, the mismatching in acoustic characteristics, such as frequency characteristics and phases. Furthermore, the first capacitor 258 and the second capacitor 260 share the back chamber 31, the air gap 252, and the vent hole 256. This makes it possible to further reduce, in the chip, the mismatching in the acoustic characteristics.

Incidentally, in the case of the above configuration described in each of Japanese Unexamined Patent Publication No. 2008-245267 and U.S. Patent Application Publication No. 2007/0047746, the plurality of independent acoustic sensors are formed on one chip and, as such, the size of the chip is increased. Moreover, the configuration has an increased number of longer wires extending from the respective acoustic sensors to the ASIC, thereby resulting in an increase in parasitic capacitance and parasitic resistance. This leads to deterioration of various characteristics (such as, the detection sensitivity and SNR (signal-to-noise ratio)).

As opposed to this, in this embodiment, the first capacitor 258 and the second capacitor 260 are formed with the vibrating membrane 22 and the fixed membrane 23. Therefore, as compared with conventional techniques, this embodiment can reduce the size of the chip and reduce the length of the wires, thereby making it possible to prevent deterioration of the various characteristics.

Moreover, in this embodiment, the air gap 252 is constant in size while the vibrating membrane 22 stands still. This makes it possible to further reduce, in the chip, the mismatching in the acoustic characteristics, since the first capacitor 258 and the second capacitor 260 are provided in the same interval between the vibrating electrode 220 and the fixed electrodes 230a, 230b. According to this embodiment, it is possible to simplify the step of forming the vibrating electrode 220 and the fixed electrodes 230a, 230b in the manufacturing process of the acoustic sensor 11.

Moreover, in this embodiment, each of the vibrating electrode 220 and the fixed electrodes 230a, 230b is formed to have a uniform thickness. This allows the chips to have more similar variations between the detection sensitivities of the first capacitor 258 and the second capacitor 260 where the variations are caused by fabrication. This makes it possible to reduce the variation between the chips with regard to the difference between the detection sensitivity of the first capacitor 258 and the second capacitors 260.

Moreover, in this embodiment, the vibrating membrane 22 has a base portion 266 that is circular. In comparison with a vibrating membrane having a base portion that is rectangular or square, the vibrating membrane 22 of this embodiment can reduce a concentration of a stress. As a result, durability against an external stress and an internal stress is enhanced.

Moreover, in this embodiment, the vent hole 256 is present between the substrate 21 and the membrane 22. Accordingly, in comparison with a configuration in which the vent hole is not present, the displacement of the vibrating membrane can be increased, and the detection sensitivity can be enhanced. Moreover, this configuration makes the vibrating membrane less likely to be warped by external force and the like. Accordingly, the acoustic characteristics are less likely to be varied and influence by variations of an outside air pressure are reduced.

Note that a method of manufacturing the acoustic sensor 11 of this embodiment is different from the method of manufacturing the conventional acoustic sensor only in terms of a mask for forming the first electrode 230a. Specifically, by the mask of this embodiment, the first electrode 230a and the second electrode 230b are formed separately.

That is, first, a sacrificial layer ($SiO_2$) is formed on an upper surface of a monocrystalline silicon substrate serving as the semiconductor substrate 21. Next, a polycrystalline silicon layer is formed and etched on the sacrificial layer, whereby the vibrating membrane 22 is formed. Next, another sacrificial layer is formed so as to cover the vibrating membrane 22.

Next, a polycrystalline silicon layer and a silicon nitride layer are formed, so as to cover the sacrificial layer, and then etched, whereby the fixed membrane 23, including the fixed electrodes 230a, 230b and the protecting membrane 231, is formed. Here, the polycrystalline silicon layer is formed so as to be separated into a central portion and a peripheral portion by a mask pattern and the like, whereby the fixed electrodes 230a, 230b is formed separately as the first electrode 230a and the second electrode 230b.

Next, the monocrystalline silicon substrate is etched, whereby the opening 31 is formed. Then the sacrificial layer is etched through the sound hole portions 32, whereby the air gap between the vibrating membrane 22 and the fixed membrane 23 is formed, the insulating layer 30 is formed, and thus, the acoustic sensor 11 is completed.

Figure 3:
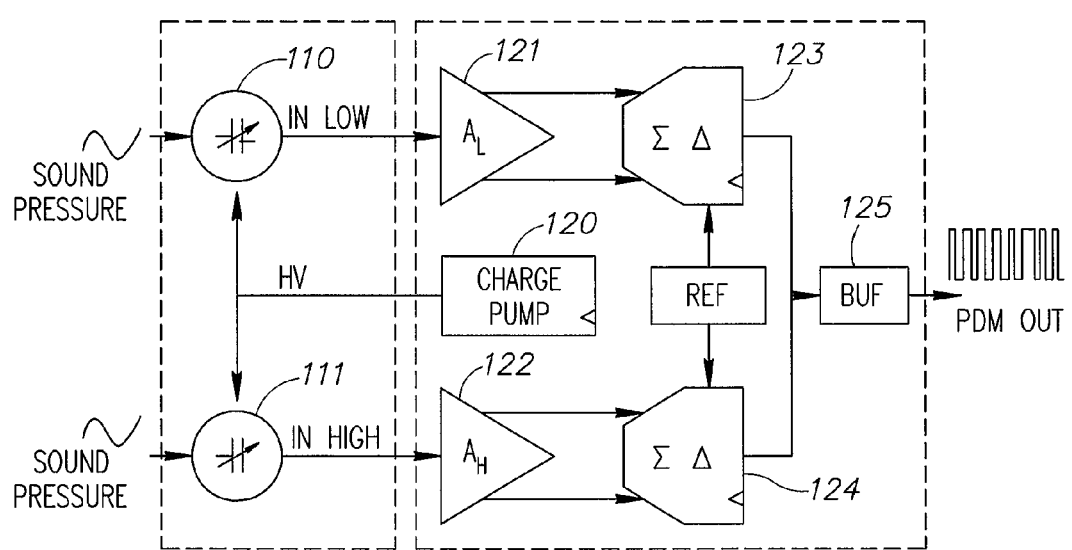
FIG. 3 is a circuit diagram of the MEMS microphone.

FIG. 3 is a circuit diagram of the MEMS microphone package 10 shown in FIG. 2A. As shown in FIG. 3, the acoustic sensor 11 includes a low-sensitivity variable capacitor 110 and a high-sensitivity variable capacitor 111, each of which has a capacitance that is changed by the sound wave. The low-sensitivity variable capacitor 110 corresponds to the second capacitor 260, and the high-sensitivity variable capacitor 111 corresponds to the first capacitor 258.

Moreover, the ASIC 12 includes a charge pump 120, an amplifier 121 for a low-sensitivity variable capacitor, an amplifier 122 for a high-sensitivity variable capacitor, ΣΔ (sigma-delta, ΔΣ-type) ADCs (Analog-to-Digital Converters) 123 and 124, and a buffer 125.

A high voltage HV outputted from the charge pump 120 is applied to the variable capacitors 110 and 111 of the acoustic sensor 11, whereby the sound wave is converted into electrical signals by the variable capacitors 110 and 111. The electrical signal converted by the low-sensitivity variable capacitor 110 is amplified by the amplifier 121 for the low-sensitivity variable capacitor, and is converted into a digital signal by the ΣΔ-type ADC 123. In a similar manner, the electrical signal converted by the high-sensitivity variable capacitor 111 is amplified in the amplifier 122 for the high-sensitivity variable capacitor, and is converted into a digital signal by the ΣΔ-type ADC 124. The digital signals converted by the ΣΔ-type ADCs 123 and 124 are outputted as PDM (pulse density modulation) signals through the buffer 125 to the outside.

Note that, in the example of FIG. 3, two digital signals obtained as a result of the conversion by the ΣΔ-type ADCs 123 and 124 are described as being combined with each other and are outputted to a single data line. Alternatively, the two digital signals may be outputted to different data lines.

In this embodiment, the fixed electrodes 230a, 230b are divided, and the vibrating electrode 220 is not divided. In this case, in comparison with the configuration where both of the fixed electrodes 230a, 230b and the vibrating electrode 220 are divided, this embodiment has fewer connections to the ASIC 12 so that productivity is enhanced. Moreover, the number of connection terminals to the ASIC 12 is decreased, which makes it possible to reduce the parasitic capacitance caused by the connection terminals, so as to improve the characteristics. Moreover, only a single voltage is applied from the charge pump 120 to the variable capacitors. Accordingly, the size of the ASIC 12, including the charge pump 120, can be reduced, manufacturing costs can be reduced, and variations in the difference between the detection sensitivities can be reduced, where the variation is caused by variations in fabrication of the charge pump 120.

Second Embodiment

Figure 4A:
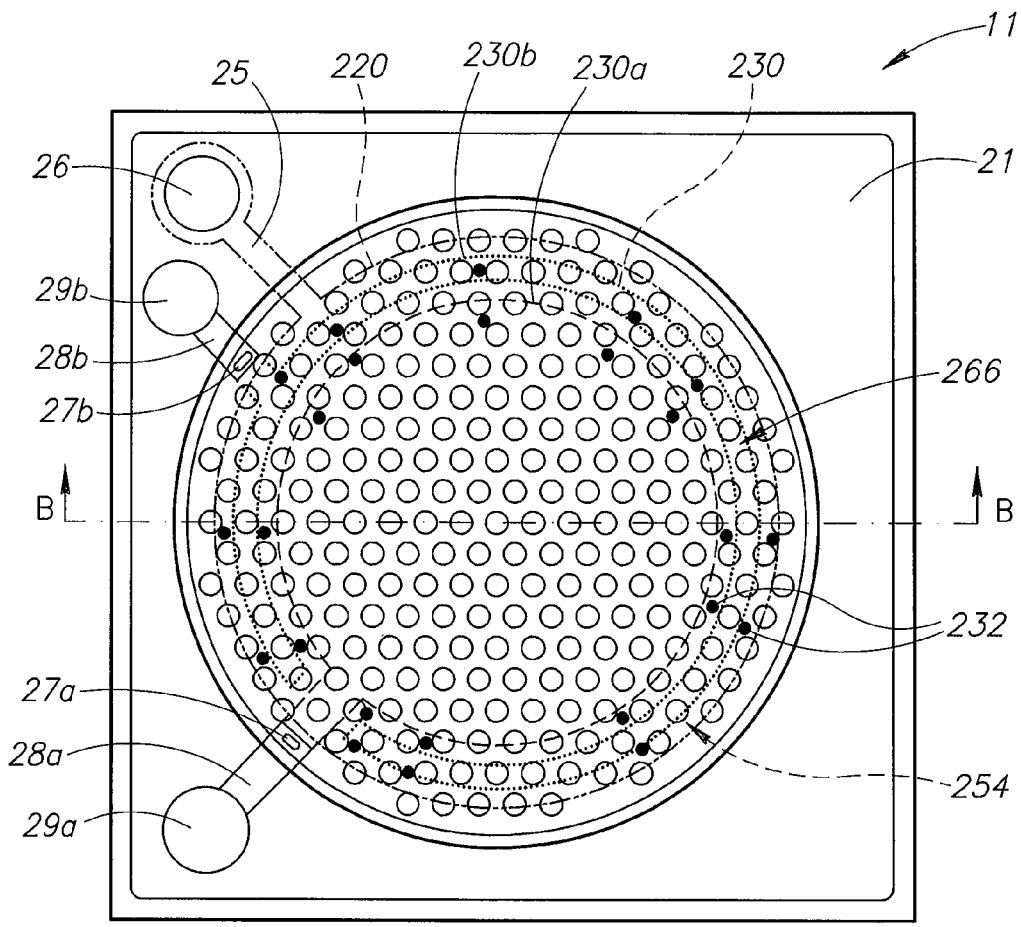
FIGS. 4A and 4B are a plan view and a cross-sectional view, which show a schematic configuration of an acoustic sensor in a MEMS microphone according to another embodiment of the present disclosure.
Figure 4B:
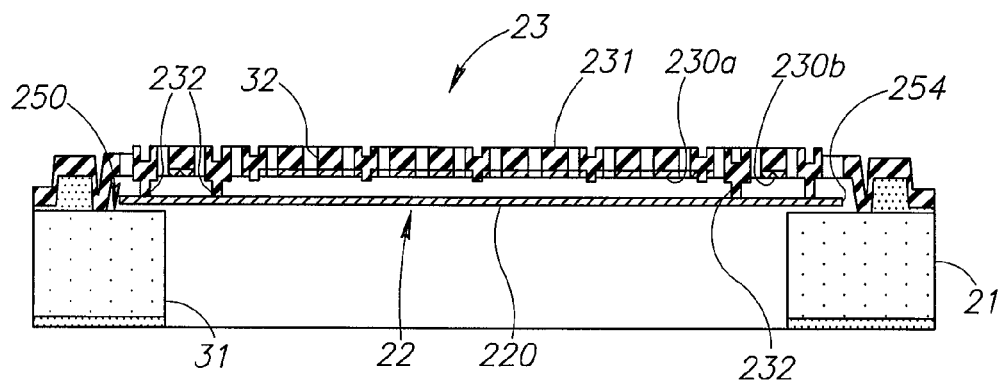

Next, a description is made of another embodiment of the present disclosure with reference to FIGS. 4A and 4B. FIGS. 4A and 4B show a schematic configuration of an alternative embodiment of the acoustic sensor 11; where FIG. 4A is a top plan view of the acoustic sensor 11, and FIG. 4B is an enlarged cross-sectional view of the acoustic sensor 11, taken along line B-B of FIG. 4A.

The acoustic sensor 11 shown in FIGS. 4A and 4B is different from the acoustic sensor 11 shown in FIGS. 1A and 1B in that the insulating layer 30 is not present, the edge 254 of a vibrating membrane 22 is not fixed to a semiconductor substrate 21, and protruding portions 232 extend from a protecting membrane 231 of a fixed membrane 23 to the vibrating membrane 22. The protruding portions 232 are coupled to the vibrating membrane 22 and support the vibrating membrane from above, in this configuration. In some package arrangements, the acoustic sensor 11 will be in a different arrangement. For example, the membrane may be above the fixed electrode 230, such that this embodiment would be upside down compared to what is shown.

The protruding portions 232 are provided so as to be apart from each other and coupled to the membrane near the second electrode 230b. The acoustic sensor 11 shown in FIGS. 4A and 4B is similar to the acoustic sensor 11 shown in FIGS. 1A and 1B in other components. Note that the same reference numerals are denoted to components having similar functions to those of the components described in the above embodiment.

The vibrating membrane 22 is not fixed to the semiconductor substrate 21. However, upon application of a voltage between the vibrating membrane 22 (vibrating electrode 220) and the fixed electrodes 230a, 230b, the vibrating membrane 22 is held by the protruding portions 232 by electrostatic forces. Therefore, influences from an external stress and an internal stress applied to the vibrating membrane 22 are reduced. Moreover, the protruding portions 232 restrict vibrations of a peripheral portion of the vibrating membrane 22. Accordingly, it is possible to reduce a detection sensitivity of a second capacitor 260 which is made of the second electrode 230b and the peripheral portion of the vibrating electrode 220. As a result, it is possible to further increase a sensitivity difference between the detection sensitivity of the first capacitor 258 and the detection sensitivity of the second capacitor 260.

During a resting state, where no voltage is supplied to the fixed electrodes 230a, 230b or the membrane, the membrane 22 rests on the top surface 250 of the substrate. When a voltage is applied, a charge is produced that attracts the membrane to the protruding portions 232.

In other embodiments, the membrane may be formed to be fixedly attached to the protruding portions.

Third Embodiment

Figure 5:
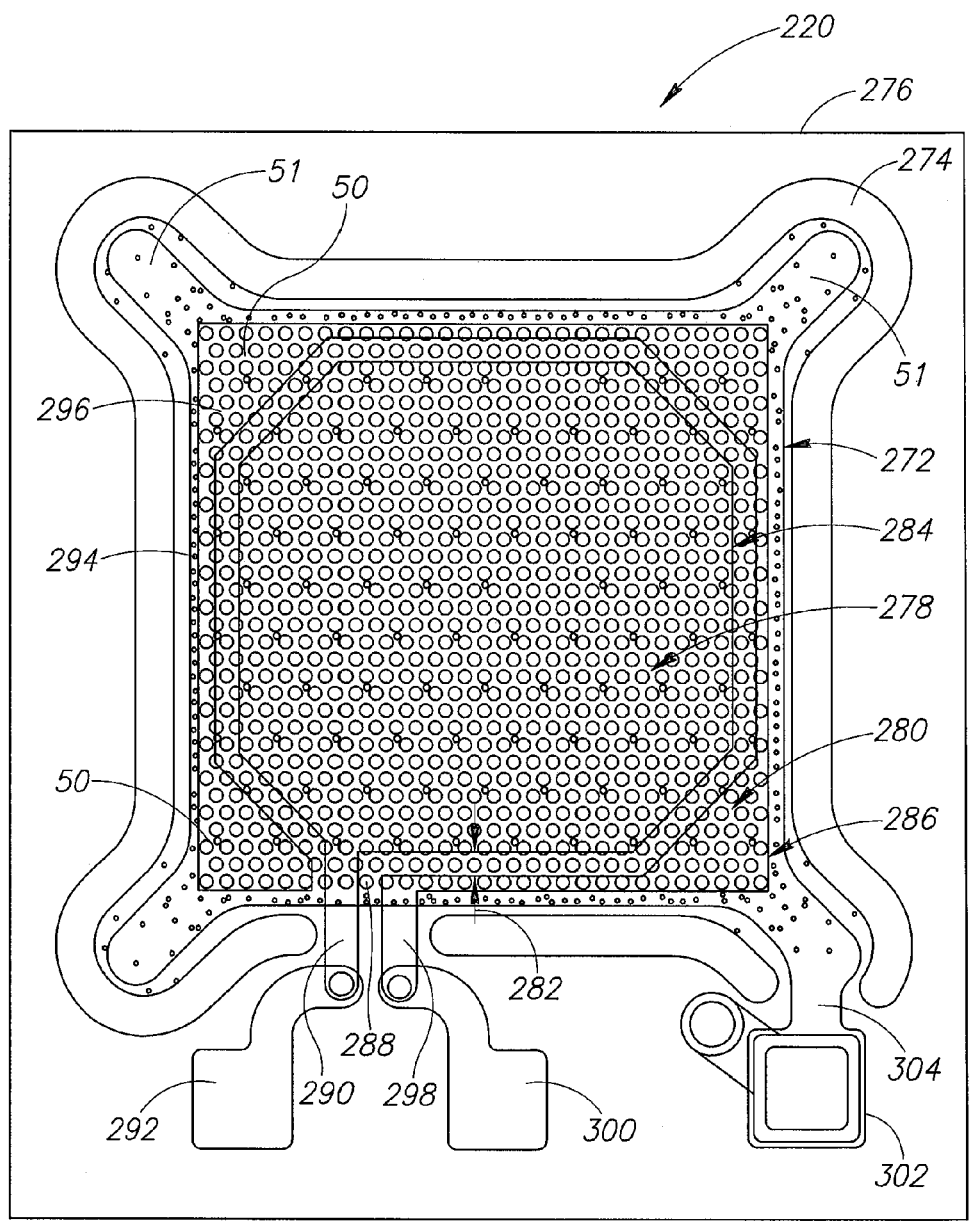
FIG. 5 is a plan view showing a schematic configuration of an acoustic sensor in a MEMS microphone according to still another embodiment of the present disclosure.
Figure 6:
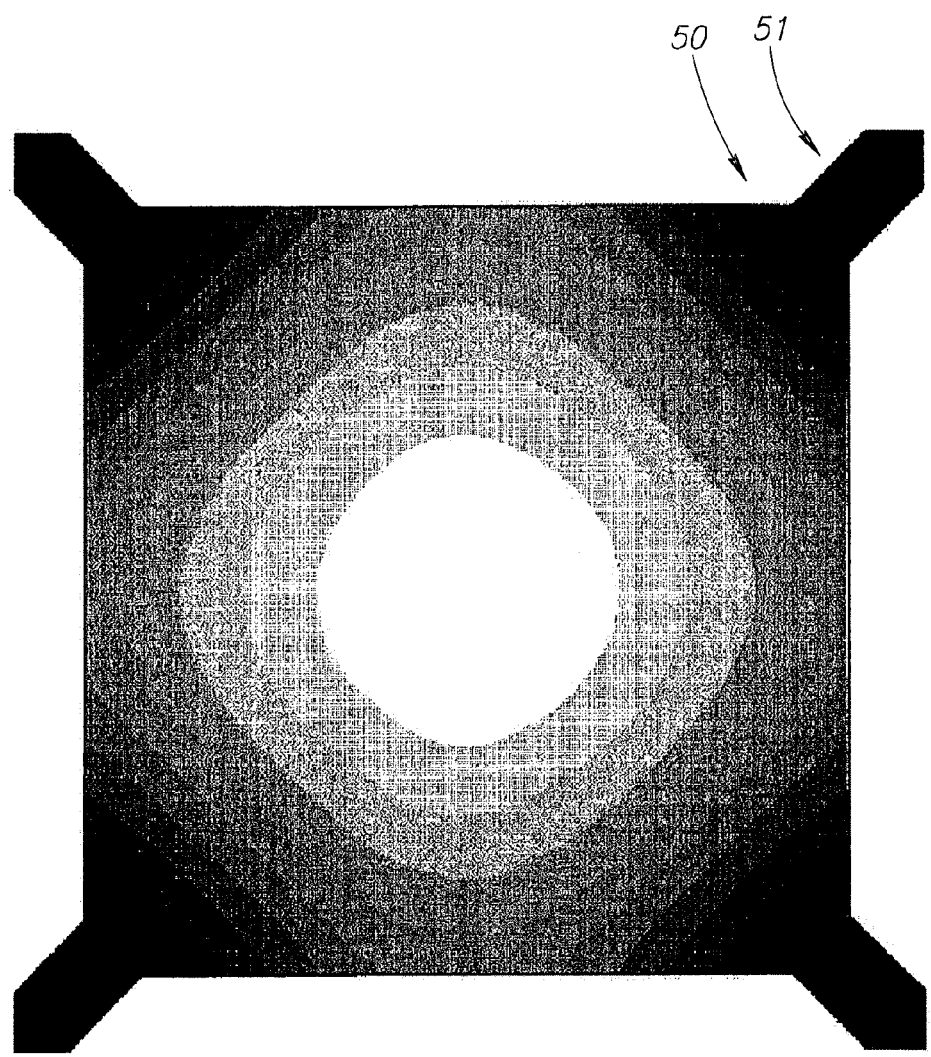
FIG. 6 is a plan view showing a vibration amount of a vibrating membrane of the acoustic sensor.

Next, a description is made of still another embodiment of the present disclosure with reference to FIGS. 5 and 6. FIG. 5 is a plan view showing an acoustic sensor 270 according to this embodiment. The plan view of FIG. 5 is a view of a vibrating membrane 272 not covered by a protecting membrane. Locations 274 where the protecting membrane couples to a substrate 276 of the sensor 270 are shown.

The membrane 272 includes a first portion 278 centrally positioned with respect to a second portion 280. The protecting membrane is not shown; however, an outline of a first electrode 284 and a second electrode 286 coupled to the protecting membrane are shown with solid lines. The protecting membrane is a fixed membrane that is configured to hold the first and second electrodes 284 and 286 in place as the vibrating membrane 272 moves in response to sound waves. The second electrode 286 surrounds the first electrode 284 on all sides, except for an opening 288 where a first extension 290 extends from the first electrode to couple the first electrode to a contact pad 292.

The acoustic sensor shown in FIG. 5 is different in the shape of the vibrating membrane 22 from the acoustic sensor shown in FIGS. 1A and 1B, and therefore, is different therefrom also in the shape of the fixed membrane. Note that other components of the acoustic sensor 11 shown in FIG. 5 are similar to those of the acoustic sensor shown in FIGS. 1A and 1B. The membrane has a generally square shape with elongated extended portions 51 from corners of the square. A width of the membrane is wider than a width of the second electrode. The protecting membrane is wider than the membrane, with the second electrode positioned towards a center of the protecting membrane. The first electrode is within the second electrode.

The second electrode 286 is separated from the first electrode by an insulator having a width 282. The insulator may be a dielectric material or air. The first electrode 284 forms a first capacitor with the first portion 278 of the membrane and the second electrode 286 forms a second capacitor with the second portion 280. In this embodiment, the first electrode is an octagon while the second electrode has elongated rectangular sides 294 connected at triangular corners 296. The triangular corners 296 have a larger surface area and are positioned over the second portion of the membrane, which has less movement than the first portion.

The vibrating membrane 22 of the acoustic sensor 11 shown in FIGS. 1A and 1B is circular and has the edge portion fixed to the substrate 21. On the other hand, as shown in FIG. 5, the vibrating membrane 272 of the acoustic sensor of this embodiment has a base portion having a substantially square shape having corner portions 50 each extending outward from a center of the vibrating membrane 272, so that the vibrating membrane 272 is fixed to the semiconductor substrate 276 at such extended portions 51.

The second electrode 286 has a second extension 298 that extends from the second electrode to couple the second electrode to a contact pad 300. The membrane 272 is coupled to a contact pad 302 through an extension 304 from one of the corner portions 50.

FIG. 6 shows an amount that the vibrating membrane 272 vibrates, which is observed when a predetermined sound wave reaches the vibrating membrane 272. In FIG. 6, a region which vibrates a larger amount is shown to be brighter, more white. As shown in FIG. 6, the vibrating membrane 272 vibrates a small amount in the corner portions 50 and the extended portions 51. Thus, as shown in FIG. 5, the fixed first and second electrodes 284, 286 are together substantially square. The center portion serves as the first electrode 284, and the corner portions 50 and connection portions by which the corner portions are connected to each other serve as the second electrode 286. As such, no matter the shape of the vibrating membrane 272, the first electrode 284 is formed so as to be facing the center region of the vibrating membrane 272, and the second electrode 286 is formed so as to be facing the vicinity of a region of the vibrating membrane 272 at which the vibrating membrane is fixed to the semiconductor substrate 21.

In this embodiment, the base portion of the vibrating membrane 272 is square. This allows effective use of an upper area of a rectangle or square chip. Moreover, in comparison with the vibrating membrane 22 in which the base portion is circular, the vibrating membrane 272 having the square base portion allows for a variety of ways in which the fixed portion may be arranged to fix the vibrating membrane 272 and the semiconductor substrate 276 to each other. Accordingly, the detection sensitivity can be varied as well. Moreover, in comparison with the vibrating membrane 22 in which the base portion is circular, the vibrating membrane 272 having a square base portion deforms in a substantial plate shape and substantially in parallel with the fixed membrane upon arrival of the sound wave at the vibrating membrane 272. The variable capacitor functions as a capacitor similar to a parallel plate capacitor, which is made of electrodes disposed at an interval being variable depending on a sound pressure. As a result, a change of the capacitance has good linearity with respect to the sound pressure.

Fourth Embodiment

Figure 7:
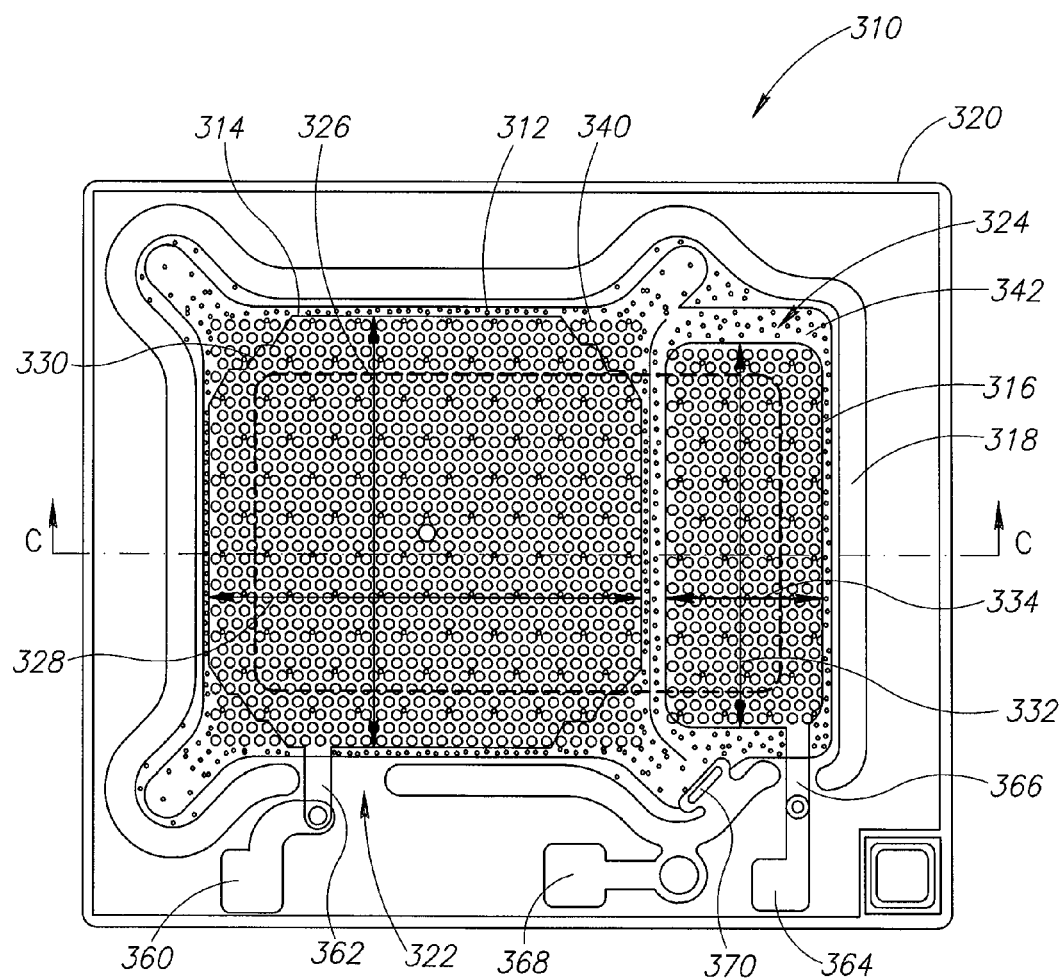
FIG. 7 is a plan view showing a schematic configuration of an acoustic sensor in a MEMS microphone according to still another embodiment of the present disclosure.
Figure 8:
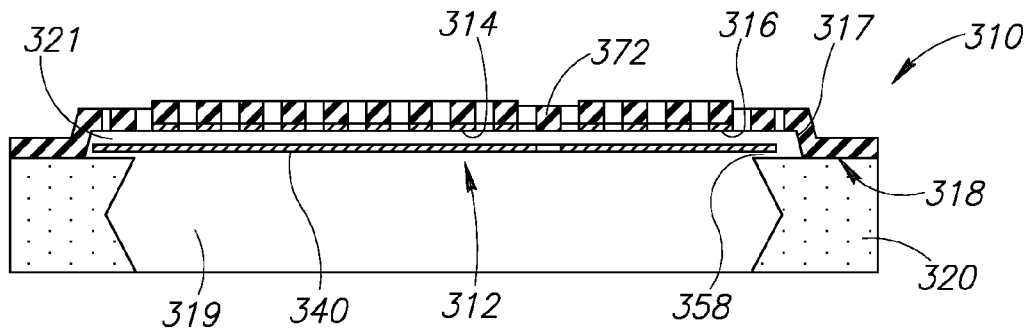
FIG. 8 is a cross-sectional view of the acoustic sensor of the present disclosure.
Figure 9:
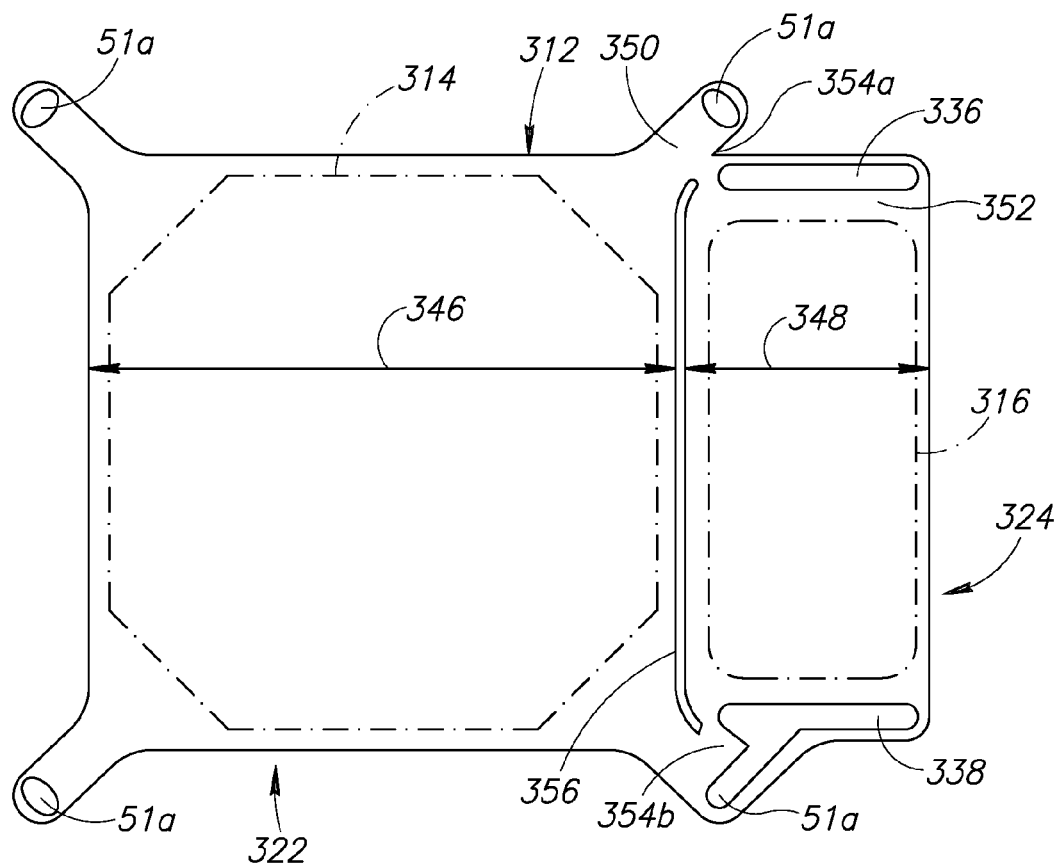
FIG. 9 is a plan view showing a schematic configuration of a vibrating membrane in the acoustic sensor of the present disclosure.
Figure 10:
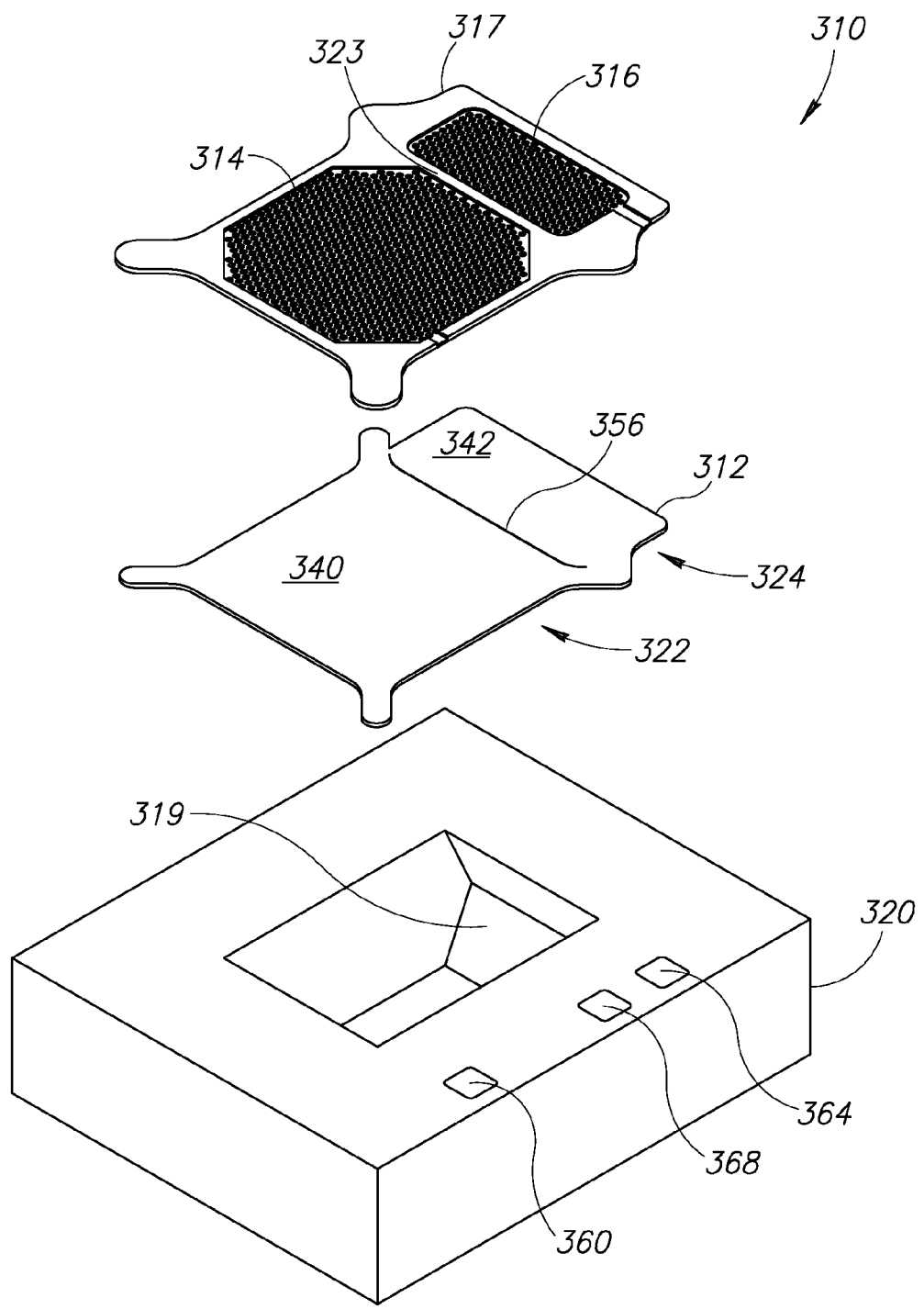
FIG. 10 is an exploded assembly view of the acoustic sensor of the present disclosure.

A description will be made of still another embodiment of the present disclosure with reference to FIG. 7 to FIG. 12. FIG. 7 is a plan view showing a schematic configuration of an acoustic sensor 310 according to this embodiment, and FIG. 8 is a cross-sectional view of the acoustic sensor 310, taken along line C-C of FIG. 7. FIG. 9 is a plan view showing a schematic configuration of a vibrating membrane 312 in the acoustic sensor 310 of this embodiment. FIG. 10 is an exploded view of the acoustic sensor 310 according to this embodiment. Note that, in FIG. 7, only an outline of a first electrode 314 and a second electrode 316 are shown. A location 318 where a protecting membrane 317 attaches to a substrate 320 is also shown. There is a chamber 319 in the substrate, aligned with respect to the membrane 312. The protecting membrane provides support for the first and second electrodes that are fixed to a surface of the protecting membrane that faces the vibrating membrane 312.

The acoustic sensor 310 shown in FIGS. 7 to 10 is different from the acoustic sensor 310 shown in FIG. 5 in that the vibrating membrane 312 and the second electrode are extended sideward from a base portion 322. The first electrode forms a first capacitor with a first portion 340 of the membrane 312 and the second electrode forms a second capacitor with a second portion 342 of the membrane 312.

The first electrode 314 is associated with the base portion 322, which is square in shape and larger than a peripheral portion 324. The second electrode 316 is associated with the peripheral portion 324. The first electrode has a first dimension 326 which is the same as a second dimension 328. In other embodiments, the first and second dimension will be different. At corners of the first electrode, edges 330 are stepped such that the overall all shape is octagonal.

The second electrode 316 is rectangular in shape and has a first dimension 332 and a second dimension 334. The first dimension is larger than the second dimension in this embodiment. In an alternative embodiment, the first dimension and the second dimension of the second electrode may be equal or more similar in dimension. The first dimension 332 of the second electrode is smaller than the first dimension 326 of the first electrode 314. This is a result of many factors, such as anchoring regions 336 and 338 shown in FIG. 9. It is beneficial to have different dimension so that the electrodes return different signals, i.e., they have different sensitivities.

In FIG. 9, a first dashed line represents the first electrode 314 which is electrically isolated from the second electrode 316 (see the second dashed line). The first electrode and the second electrode each have their own separate electrical connections to the respective contact pads, 360, 364. An isolation bridge 323 is positioned between the first electrode 314 and the second electrode 316 (see FIG. 10). The isolation bridge 323 is a dielectric material that is positioned above the boundary region 372.

In the vibrating membrane 312, the base portion 322 is wider than the peripheral portion 324. More particularly, a width 346 of the base portion is larger than a width 348 of the peripheral portion (see FIG. 9). Moreover, in the vibrating membrane 312, the base portion is fixed at fixed portions 51a on tips of respective extended portions 350, and the peripheral portion is fixed at anchoring regions 336 in respective edge portions 352 in upper and lower sides (when seen in FIG. 9).

The extended portions 350 extend from four corners of the base portion of the membrane 312. The extended portions have a consistent width and a rounded tip. The two extended fixed portions 51a closest to the peripheral portion 324 merge with the edge portions 352 at points 354a and 354b. The base portion 322 is separated from the peripheral portion 324 by a slit or opening 356. In this embodiment, the slit has a linear central region and curved outer portions. The outer portions curve away from a center of the base portion 322 and towards the peripheral portion. The curvature is slight. In addition, the slit separates the extended portions 350 from the edge portions 352 at the points 354a and 354b. This slit is visible in FIG. 7; however, due to the complexity of the Figure, the dimensions and features of the slit are less clear. FIG. 9 is an enhanced view of the slit 356.

The edges of the vibrating membrane 312 have unfixed portions, which serve as gaps 358 (vent holes with respect to the substrate 320). In FIG. 8, the membrane 312 is suspended because the cross-sectional line does not pass through one of the anchors 51a. The vibrating membrane 312 is configured such that a ratio of an area of the fixed portions 51a of the base portion with respect to an area of the base portion is smaller than a ratio of an area of the anchoring regions 336 of the peripheral portion with respect to an area of the peripheral portion. Accordingly, this causes the base portion to be displaced more than the peripheral portion. In the example of FIG. 9, the fixed portion 51a and the anchoring region 338 on the lower right-hand side of the image are connected to each other.

In FIG. 7, the first electrode 314 is coupled to a contact pad 360 through an extension 362. The second electrode 316 is coupled to a contact pad 364 through an extension 366. The membrane 312 is coupled to another contact pad 368 through a connection 370 positioned adjacent to the fixed portion 51a and the anchoring region 338.

Figure 11:
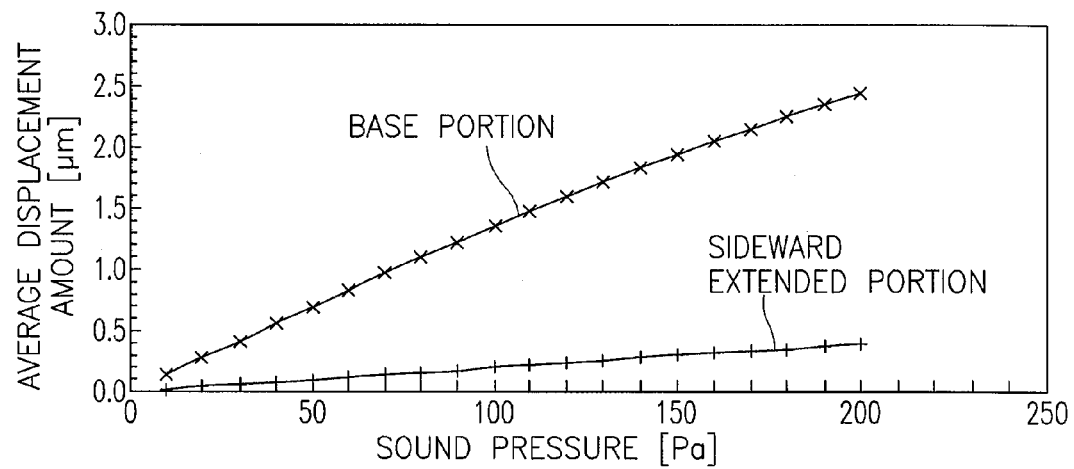
FIG. 11 is a graph showing a change of an average displacement amount of the vibrating membrane with respect to a sound pressure applied to the vibrating membrane in the acoustic sensor of the present disclosure.

FIG. 11 shows a graph illustrating a change of an average displacement amount of each portion of the vibrating membrane 312 in response to the sound pressure applied to the vibrating membrane 312. Note that a unit of the sound pressure is Pa, and that a unit of the average displacement amount is μm. Referring to FIG. 11, it can be understood that the base portion has a larger average displacement amount than the peripheral portion. Hence, the base portion of the vibrating membrane 312 and of the first electrode 314 form a variable capacitor which functions as a high-sensitivity capacitor capable of favorably detecting a small sound.

The graph in FIG. 11 shows that a graph line representing the average displacement amount of the base portion in response to the sound pressure inclines at a constant degree until the sound pressure reaches 120 Pa, but declines at gradually decreasing degrees when the sound pressure exceeds 120 Pa. On the other hand, a graph line representing the average displacement amount of the sideward extended portion in response to the sound pressure inclines at a constant degree until the sound pressure reaches 200 Pa. Hence, the peripheral portion of the vibrating membrane 312 and the second electrode forms a variable capacitor which functions as a low-sensitivity variable capacitor capable of favorably detecting a large sound.

Furthermore, the vibrating membrane 312 has a slit 356 formed so as to be facing a boundary region 372 between the first electrode 314 and the second electrode 316. Since the slit 356 is formed only in a part of the vibrating membrane 312 that faces the boundary region 372, the base portion and the peripheral portion are physically and electrically connected to each other.

Incidentally, in the case where the slit 356 is not formed, the base portion and the peripheral portion are adjoined with each other, and accordingly, the displacement of the base portion and the displacement of the peripheral portion affect each other. As opposed to this, in this embodiment, since the slit 356 is formed, the base portion and the peripheral portion are separated from each other, which results in a more significant difference between the displacements of the base portion and the peripheral portion.

Moreover, in the case where the opening 319 and the air gap 321 have different air pressures, the air flows from the opening 319 to the air gap 321 through the slit 356, or vice versa, which reduces the difference between the air pressures of the opening 319 and the air gap 321. Hence, it is possible to reduce a variation of the characteristics of the acoustic sensor 310 that is caused by the changes of the air pressure, and also to reduce a variation of the characteristics, noise and the like, caused by changes of an external fluid such as noise by a wind.

Note that, if a width of the slit 356 is too wide, then a ventilation effect is intensified, and an amount of the air going through the slit 356 becomes too large, which may result in a drop of a roll-off frequency that deteriorates the low-frequency characteristics. A description is made below of this point in detail.

Figure 12:
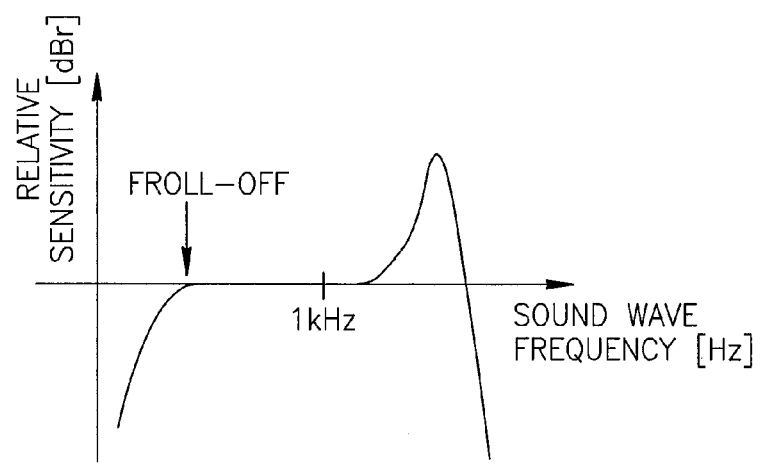
FIG. 12 is a graph showing typical frequency characteristics in the MEMS microphone of the present disclosure.

FIG. 12 shows typical frequency characteristics of the MEMS microphone. A vertical axis in FIG. 12 represents a frequency (unit: Hz) of the sound wave, and a horizontal axis represents a relative sensitivity (unit: dBr). In a range where a graph line is horizontal, the relative sensitivity does not depend on the frequency of the sound wave, and therefore the sound wave can be detected favorably. A lower limit frequency in this range is a roll-off frequency $f_{roll\text{-}off}$.

In general, the roll-off frequency $f_{roll\text{-}off}$ depends on an acoustic resistance $R_{venthole}$ of the ventilation hole and a compliance of the air (air spring constant) $C_{backchamber}$ in the back chamber (opening 31), and is represented by the following expression.

$$f_{roll\text{-}off} \propto 1/(R_{venthole} \times C_{backchamber}) \quad (1)$$

The acoustic resistance $R_{venthole}$ becomes smaller as a width of the slit becomes larger, although the acoustic resistance $R_{venthole}$ is also affected by a length of the slit 356. Hence, in accordance with the expression (1), the roll-off frequency $f_{roll\text{-}off}$ becomes larger, so that the low frequency characteristics are deteriorated. For example, if the width of the slit 356 is 1 μm, then the roll-off frequency $f_{roll\text{-}off}$ is 50 Hz or less; however, if the width of the slit 356 is 10 μm, then the roll-off frequency $f_{roll\text{-}off}$ is no less than 500 Hz. Therefore, if the width of the slit 356 exceeds 10 μm, the flow frequency characteristics are remarkably deteriorated, and the sound quality is impaired. Hence, it is desirable that the width of the slit 356 be 10 μm or less.

Fifth Embodiment

Figure 13:
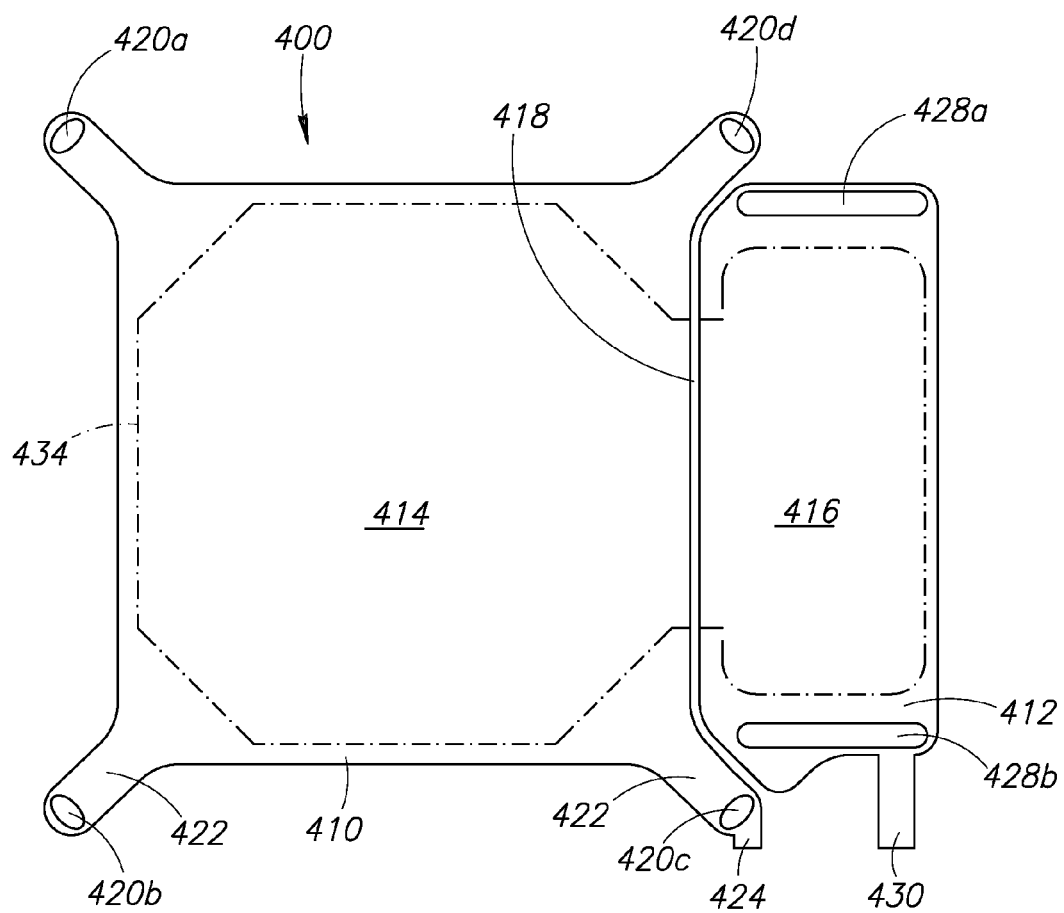
FIG. 13 is a plan view showing a schematic configuration of a vibrating membrane in an acoustic sensor of a MEMS microphone according to another embodiment of the present disclosure.
Figure 14:
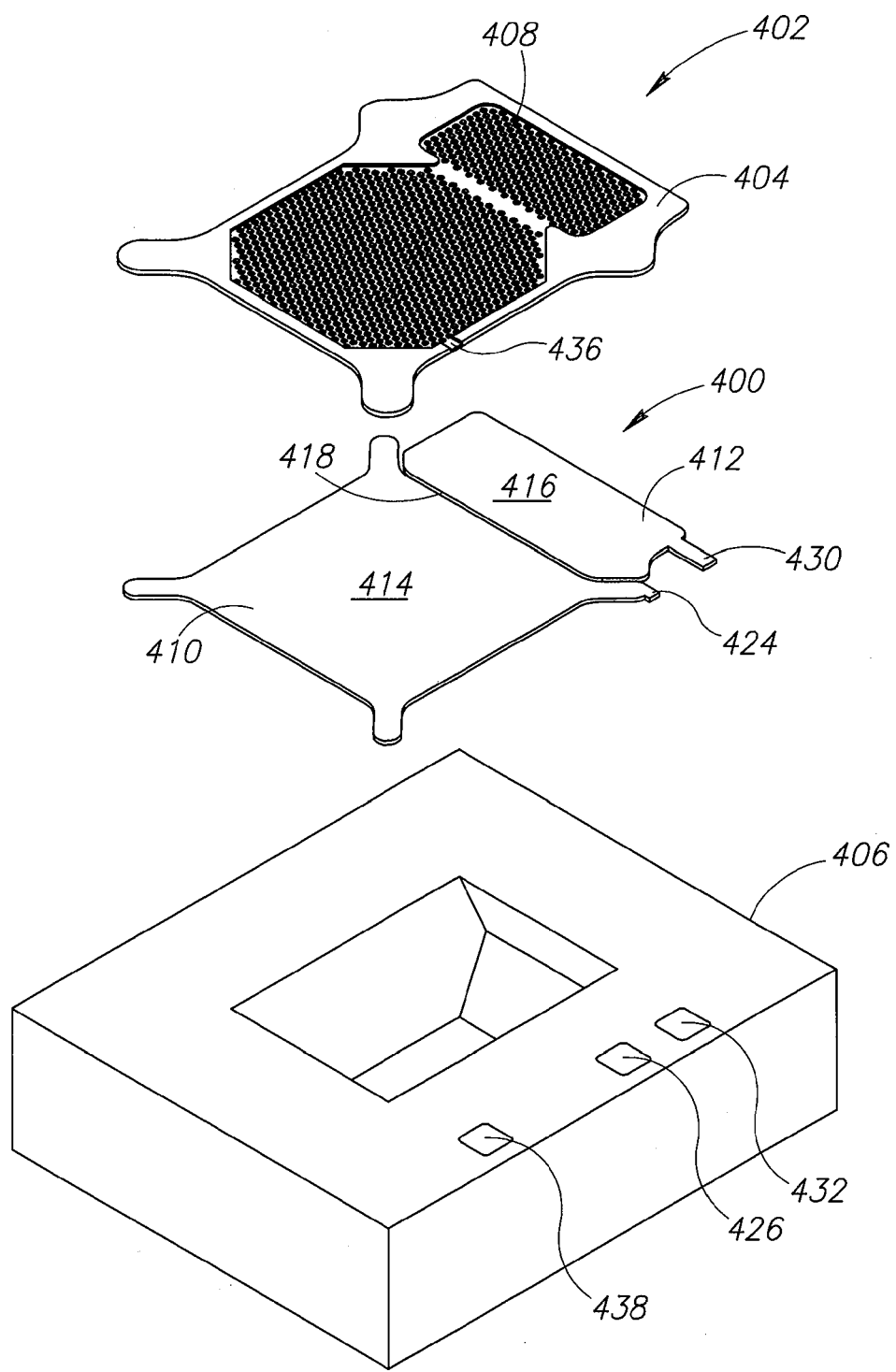
FIG. 14 is an exploded assembly view of the acoustic sensor of the present disclosure.

Next, a description will be made of another embodiment of the present disclosure with reference to FIG. 13 and FIG. 14. FIG. 13 is a plan view showing a schematic configuration of a vibrating membrane 400 in an acoustic sensor 402 according to this embodiment, and FIG. 14 is an exploded assembly view of the acoustic sensor 402 with a protecting membrane 404 and a substrate 406 according to this embodiment.

The acoustic sensor 402 of this embodiment is different from the acoustic sensor 310 shown in FIGS. 7-10 in that the first electrode 314 and second electrode 316 are connected to each other or are one electrode 408. The vibrating membrane 400 is divided into a first electrode 410 and a second electrode 412. The first electrode is associated with a base or main portion 414 and the second electrode 412 is positioned to the side of the base portion, i.e., the second electrode is a peripheral portion 416. The first electrode 410 is separated completely from the second electrode 412 of the membrane 400 by an opening 418.

The first electrode 410 of the membrane 400 is fixed to the substrate 406 by anchoring regions 420a, 420b, 420c, and 420d. In this embodiment, the first electrode is nearly symmetrical along a center axis. The anchoring regions are all the same size and shape, which is a very small portion of the overall surface area of the first electrode. The anchoring regions are as far from the center of the first electrode of the membrane as possible, which allows the membrane to have more significant movement in response to a sound wave. In this embodiment, the anchoring regions are ovals whose width is nearly as wide as a width of extensions 422 of the first electrode.

The extensions 422 extend away from a corner of the first electrode by a distance that is less than a quarter of the longest dimension of the first electrode. The anchoring region 420c includes a connection 424 to electrically couple the first electrode 410 to a contact pad 426 on the substrate 406.

The second electrode 412 is an elongated rectangular shape that is nestled against a right-most edge of the first electrode 410. The opening 418 separates and isolates the second electrode from the first electrode. A width of the opening 418 remains constant along a linear portion (vertically oriented in FIG. 13 between the first electrode 410 and the second electrode 412. The opening follows a shape of the first electrode as the extensions 422 move away from a central portion of the first electrode. The width of the opening may increase slightly as the opening moves away from the linear portion toward the anchoring regions, such as region 420d and 420c.

The second electrode includes a top anchoring region 428a and a bottom anchoring region 428b. The top and bottom anchoring regions are elongated ovals that have a longer longest dimension than the anchoring regions 420 of the first electrode. The anchoring regions fix a top and bottom portion of the second electrode to restrict movement to generate a different sensitivity in this electrode as compared to the first electrode.

Along the top of the second electrode, an upper left-most edge is like a clipped edge of a rectangle or a folded corner of a piece of paper that matches a slope of the edge of the extension 422 of the first electrode. Along the bottom of the second electrode, a bottom left-most edge has a different shape, with a ridge or bump that protrudes away from the anchoring region 428b. There is also a connection 430 that is configured to electrically connect the second electrode to a contact pad 432 on the substrate. In this embodiment, the first electrode and the second electrode of the membrane 400 can be held at different potentials.

A dashed line 434 corresponds to a shape of the electrode 408 of the protecting membrane 404. The protecting membrane 404 includes a connection 436 configured to electrically connect the electrode 408 to a contact pad 438 on the substrate. The substrate 406 has the same arrangement of the contact pads as previous embodiments. The arrangement of the vibrating membrane with respect to the protecting membrane can be varied without changing the arrangement of the contact pads. This will minimize or prevent changes to an ASIC configured to be used in conjunction with such an acoustic transducer. The various combinations of the vibrating membrane with respect to the protecting membrane include a split vibrating membrane and two fixed electrodes in the protecting membrane, a split protecting membrane with a single vibrating membrane, and split protecting membranes and vibrating membranes.

The acoustic sensor 402 of this embodiment is similar to the acoustic sensor 402 shown in FIG. 7 to FIG. 10 in other components. As described above, the vibrating membrane 400 can be divided. In this case, the first electrode 410 and the second electrode 412 are connected to the amplifiers 121 and 122 of the ASIC 12 in FIG. 3.

The present disclosure is not limited to the respective embodiments mentioned above, and is modifiable in various ways within the scope described in the claims. Embodiments obtained by appropriately combining technical means individually disclosed in the different embodiments are also incorporated in the technical scope of the present disclosure.

For example, in the embodiments described above, each of the sound hole portions 32 has a cross section that is circular; however, the sound hole portions may have a cross section in any shape, such as a triangle or a quadrangle.

Moreover, in some of the embodiments mentioned above, one of the vibrating electrode and the first and second electrodes are divided into two; however, in other embodiments there may be three or more electrodes.

Figure 15:
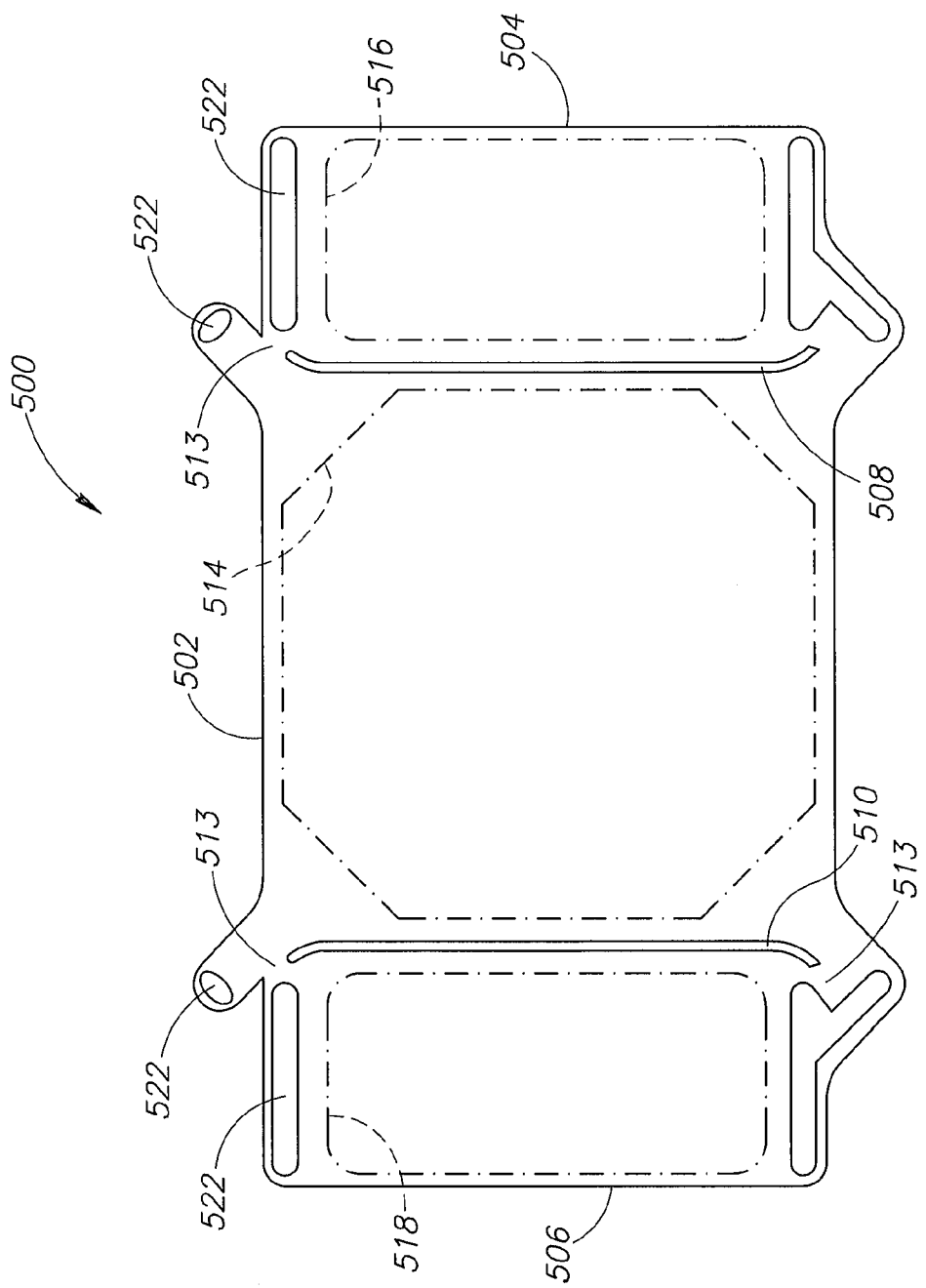
FIGS. 15-18 are alternative embodiments of an acoustic sensor of the present disclosure.
Figure 16:
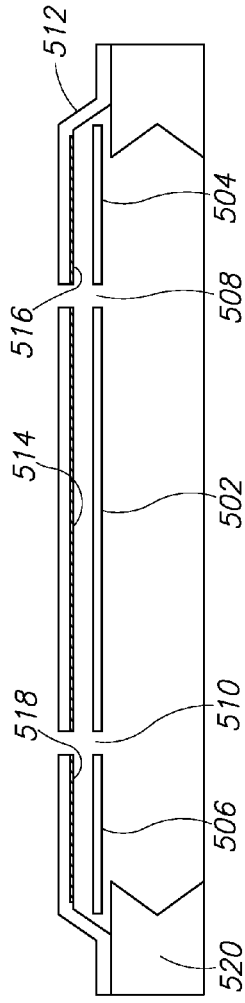

FIG. 15 is top down view of a vibrating membrane 500 formed in accordance with the present disclosure. FIG. 16 is a simplified cross-sectional view of an acoustic transducer including the vibrating membrane 500. The vibrating membrane 500 includes a first portion 502 positioned centrally, a second portion 504 positioned to the right of the first portion, and a third portion 506 positioned to the left of the first portion. The first portion and the second portion are separated by a first partial opening 508 while the first portion and the third portion are separated by a second partial opening 510. The openings allow the portions to move somewhat independently while keeping the entire membrane at the same potential.

The portions are configured to be one plate of a variable capacitor that detects changes in sound pressure. The dashed lines in the portions correspond to a position of an electrode in a protecting membrane, such as the protecting membrane 512 in FIG. 16. In particular, a first fixed electrode 514 is formed on a surface of the protecting membrane 512 that faces the vibrating membrane 500. The first electrode is configured to form a capacitor with the first portion 502 of the vibrating membrane 500. A second electrode 516 is formed as part of the protecting membrane 512 and is configured to form a capacitor with the second portion 504 of the vibrating membrane. A third electrode 518 is formed as part of the protecting membrane 512 and is configured to form a capacitor with the third portion 506 of the vibrating membrane. The first, second, and third electrodes are electrically isolated and are coupled to the substrate through separate electrical connections. Each of the capacitors will output a signal, which can be processed to provide a more accurate detection of sound pressure.

Each of the portions are electrodes of the respective capacitors; however, they are all electrically coupled through connection portions 513. The vibrating membrane 500 is fixed to a substrate 520 with anchoring regions 522. The anchoring regions 522 are similar to the anchoring regions described above.

Figure 17:
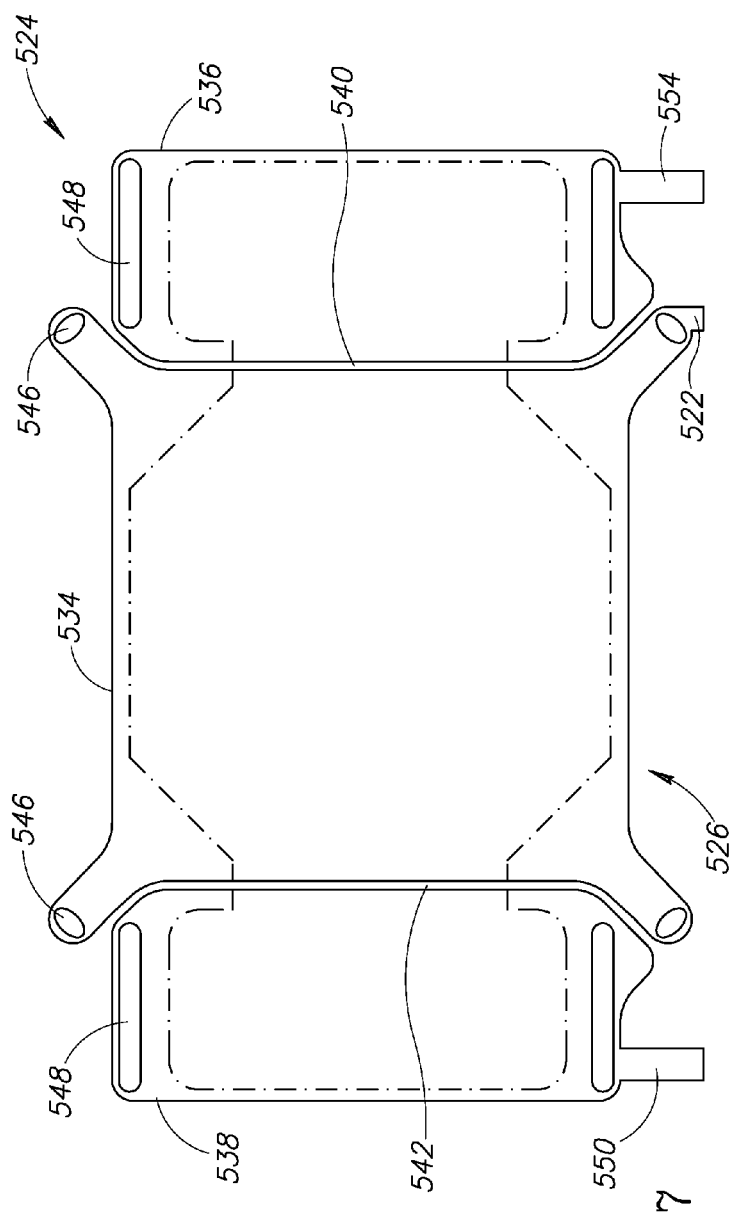
Figure 18:
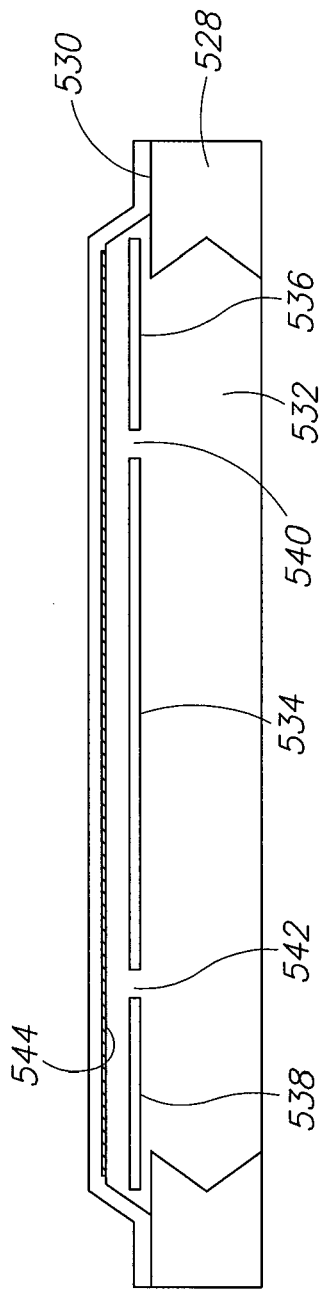

FIGS. 17 and 18 are an alternative embodiment of an acoustic transducer 524 formed in accordance with the present disclosure. The transducer includes a vibrating membrane 526 that is coupled or fixed to a substrate 528. A protecting membrane 530 is formed overlying the vibrating membrane and on the substrate 528. An opening 532 in the substrate acts as a back chamber of the acoustic transducer. In this embodiment, the protecting membrane 530 is shown as solid; however, sound holes may be formed at intervals as shown in the previous images.

The vibrating membrane 526 includes three electrodes that are isolated from each other. A first electrode 534 is a main or central electrode, which is larger than the other electrodes of the vibrating membrane 526. A second electrode 536 is positioned on one side of the first electrode and a third electrode 538 is positioned on an opposite side of the first electrode from the second. The first and second electrodes are electrically separated by a first insulator 540. The first and third electrodes are electrically separated by a second insulator 542. The first and second insulators may be air or another dielectric material.

A dashed line shown in FIG. 17 corresponds to dimensions of an electrode 544 of the protecting membrane 530. Since the electrodes of the vibrating membrane are separated, there can be a single electrode 544 in the protecting membrane.

The vibrating membrane is suspended in FIG. 18 because the cross section does not pass through any anchoring regions 546, 548. The anchoring regions may be formed in accordance with the embodiments described above.

Each electrode of the vibrating membrane has a connection that couples the electrode to a contact pad and provides the electrode with power. In particular, the first electrode 534 includes a connection 552, the second electrode 536 includes a connection 554, and the third electrode 538 includes a connection 550.

As the number of divided electrodes is increased, the number of components is increased, such as wires for transmitting signals from the divided electrodes, and electrical circuits for processing the signals in the ASIC 12. This increases the sizes of the acoustic sensor and the MEMS microphone. Hence, it is desirable that the number of divided electrodes be small, for example, two.

Moreover, both of the vibrating electrode and the fixed electrode may be divided. In this case, in response to the characteristics of the amplifiers 121 and 122 of the ASIC 12, the divided electrodes of one of the vibrating electrode and the fixed electrode are connected to the amplifiers 121 and 122, and the divided electrodes of the other of the vibrating electrode and the fixed electrode may be short-circuited to each other. Alternatively, a plurality of charge pumps 120 of the ASIC 12 may be provided, and connected to each of the divided electrodes of one of the vibrating electrode and the fixed electrode. Further, the divided electrodes of the other of the vibrating electrode and the fixed electrode may be respectively connected to the amplifiers 121 and 122.

As described above, the acoustic transducer of the present disclosure includes a substrate; a vibrating membrane provided above the substrate, including a vibrating electrode; and a fixed membrane provided above the substrate, including a fixed electrode, the acoustic transducer detecting a sound wave according to changes in capacitances between the vibrating electrode and the fixed electrode, converting the sound wave into electrical signals, and outputting the electrical signals, at least one of the vibrating electrode and the fixed electrode being divided into a plurality of divided electrodes, and the plurality of divided electrodes outputting the electrical signals.

In accordance with the above configuration, at least one of the vibrating electrode and the fixed electrode is divided into a plurality of divided electrodes, whereby the plurality of variable capacitors are formed between the vibrating electrode and the fixing electrode. This allows the plurality of divided electrodes to respectively output a plurality of electrical signals, so as to provide an acoustic transducer capable of converting the sound wave into the plurality of electrical signals.

Moreover, the plurality of variable capacitors are formed between the same vibrating membrane and the same fixed membrane. Hence, according to the present disclosure, the chips have similar variations between the detection sensitivities of the respective variable capacitors, in comparison with the conventional technique by which the pluralities of vibrating membranes and fixed membranes are provided independently. This makes it possible to reduce a variation between the chips with regard to the difference between the detection sensitivities of the variable capacitors. Moreover, the variable capacitors share the vibrating membrane and the fixed membrane. This makes it possible to reduce, in the chip, the mismatching in the acoustic characteristics such as the frequency characteristics and the phase.

Preferably, the variable capacitors have respective different detectable sound pressure levels. This allows the acoustic sensor including the plurality of variable capacitors to have an increased detectable sound pressure level, in comparison with the conventional acoustic sensor including only one variable capacitor.

In order to differentiate the detectable sound pressure levels of the respective variable capacitors from each other, at least two of the plurality of divided electrodes may be configured to have different detection sensitivities for the sound wave.

Alternatively, at least two of the plurality of divided electrodes may be configured to have respective different areas. Moreover, a region of the vibrating membrane corresponding to a larger one of said at least two of the plurality of divided electrodes which have the respective different areas vibrates, in response to the sound wave, with a greater average amplitude than a region of the vibrating membrane corresponding to a smaller one of said at least two of the plurality of divided electrodes which have the respective different areas. This allows the variable capacitors to have detectable sound pressure levels which differ from each other more greatly, thereby allowing the acoustic sensor to have further increased detectable sound pressure levels.

Moreover, where the electrode is divided into a greater number of divided electrodes, it is necessary to increase the number of components, such as wires for transmitting signals from the divided electrodes and electrical circuits for processing the signals. This increases the sizes of the acoustic sensor and the microphone. Hence, it is desirable that the number of the plurality of divided electrodes be a small number, for example, two.

Preferably, the acoustic transducer according to the present disclosure is configured such that the vibrating electrode and the fixed electrode are disposed at a certain interval. According to this configuration, since the variable capacitors are provided in the same interval between the vibrating electrode and the fixed electrode, it is possible to further reduce, in the chip, the mismatching in the acoustic characteristics. Moreover, according to this configuration, it is possible to simplify a step of forming the vibrating electrode and the fixed electrode in the manufacturing process of the acoustic transducer.

Preferably, the acoustic transducer according to the present disclosure is configured such that one of the vibrating electrode and the fixed electrode is divided into a plurality of divided electrodes. In comparison with a configuration in which both of the vibrating electrode and the fixed electrode are divided into divided electrodes, this configuration has less connections with an external circuit, so that productivity is enhanced. Moreover, according to this embodiment, the number of connection terminals to outside is decreased. This makes it possible to reduce a parasitic capacitance caused by the connection terminals, so as to improve the characteristics. Moreover, only a single voltage is necessary to be applied to the variable capacitors from an external charge pump. This makes it possible to reduce the size of the external circuit including the charge pump, to reduce a manufacturing cost, and to reduce a variation in the difference between the detection sensitivities, the variations being caused by variations of the external charge pumps made in their fabricating processes.

It is possible to achieve similar effects to the above, even if both of the vibrating electrode and the fixed electrode are divided into a plurality of divided electrodes, as long as the plurality of divided electrodes of one of the vibrating electrode and the fixed electrode are electrically short-circuited to each other.

Preferably, the acoustic transducer according to the present disclosure is configured such that each of the vibrating electrode and the fixed electrode has a uniform thickness. This configuration allows the chips to have more similar variations between the detection sensitivities of the variable capacitors, the variations being caused in fabrication. This makes it possible to further reduce the variation between the chips with regard to the differences in detection sensitivities of the variable capacitors.

Preferably, the acoustic transducer according to the present disclosure may be configured such that the vibrating membrane has a base portion shaped in a rectangle or square. Accordingly, this configuration allows effective use of an upper area of the chip. Moreover, in comparison with the vibrating membrane having a circular base portion, the vibrating membrane having the square base portion allows the fixed portion via which the vibrating membrane and the substrate are fixed to each other to change in more various ways. This makes it possible to change the detection sensitivity variously. Moreover, in comparison with the vibrating membrane having the circular base portion, the vibrating membrane having the square base portion deforms in a substantial plate shape and substantially in parallel with the fixed membrane upon arrival of the sound wave at the vibrating membrane. Therefore, the variable capacitor functions as a capacitor similar to a parallel plate capacitor, which is made of electrodes disposed at an interval being variable depending on a sound pressure. As a result, a change of the capacitance has good linearity with respect to the sound pressure.

The acoustic transducer according to the present disclosure may be configured such that the vibrating membrane has a base portion shaped in a circle. In comparison with the vibrating membrane having the base portion shaped in a rectangle or a square, the vibrating membrane having the base portion shaped in a circle can reduce stress concentrated thereto. This makes it possible to enhance durability against an external stress and an internal stress.

Preferably, the acoustic transducer according to the present disclosure is configured such that the vibrating membrane has an extended portion extended outward from the base portion, and the vibrating membrane is fixed to the substrate or the fixed membrane at the extended portion. In this configuration, it is possible to increase a displacement amount of the vibrating membrane.

The acoustic transducer according to the present disclosure may be configured such that when the vibrating electrode is divided into a plurality of divided electrodes, the vibrating membrane has a slit which is formed in a boundary region between the plurality of divided electrodes; and in a case where the fixed electrode is divided into a plurality of divided electrodes, the vibrating membrane has a slit which is formed so as to face a boundary between the plurality of divided electrodes. The slit increases a difference in displacement amounts of parts of the vibrating membrane, which parts correspond to the respective variable capacitors, thereby making it possible to increase the difference between the detection sensitivities of the variable capacitors. Moreover, the slit allows the air to go in and out therethrough. This makes it possible to control changes of the air pressure caused by the vibration of the vibrating membrane, thereby making it possible to reduce a variation of the characteristics caused by the changes of the air pressure.

Preferably, the acoustic transducer of the present disclosure is configured such that the slit has a width of 10 μm or less. This makes it possible to prevent significant deterioration of low frequency characteristics.

Preferably, the acoustic transducer according to the present disclosure is configured such that the vibrating membrane and the substrate are separated by a gap. In comparison with a configuration in which a gap is not present, this configuration makes it possible to increase a displacement amount of the vibrating membrane, thereby improving the detection sensitivity. Moreover, even if the substrate is warped by external force and the like, the vibrating membrane in such a configuration is less likely to be warped, and accordingly, the acoustic characteristics are less likely to be varied. Moreover, this configuration makes it possible to reduce an influence by variations of an outside air pressure.

The acoustic transducer according to the present disclosure is configured such that the vibrating membrane has a plurality of regions corresponding to the plurality of divided electrodes, and at least two of the plurality of corresponding regions have their respective fixed portions at which the vibrating membrane is fixed to the substrate or the fixed membrane; and a ratio of an area of one of said at least two of the plurality of corresponding regions with respect to an area of its respective fixed portion is different from a ratio of an area of the other of said at least two of the plurality of corresponding regions with respect to an area of its respective fixed portion.

In general, the displacement of the vibrating membrane changes depending on how the fixed portions are formed. For example, as the number of fixed portions increases, the vibrating membrane is displaced in response to sound pressure in a smaller amount and accordingly the detection sensitivity becomes smaller. Hence, in the above configuration, since the plurality of variable capacitors have different area ratios, the plurality of variable capacitors have different detection sensitivities.

The acoustic transducer according to the present disclosure is configured such that the substrate has an opening facing a center of the vibrating membrane, and the sound wave enters the acoustic transducer through the opening. According to this configuration, the opening is shared by the variable capacitors. Therefore, it is possible to further reduce, in the chip, the mismatching in the acoustic characteristics such as the frequency characteristics and phases. Moreover, in comparison with a configuration in which the sound wave enters the acoustic transducer through the fixed membrane, this configuration makes it possible to reduce deteriorations of the sensitivity and the frequency characteristics due to a volume effect of the opening.

Note that it is possible to achieve similar effects to the above by a microphone including the acoustic transducer having the above configuration, and an integrated circuit (IC) that supplies power to the acoustic transducer and amplifies electrical signals from the acoustic transducer to output the electrical signals to outside.

As described above, in the acoustic transducer according to the present disclosure, at least one of the vibrating electrode and the fixed electrode is divided, whereby the plurality of variable capacitors will be formed between the vibrating electrode and the fixed electrode. Accordingly, such an effect is achieved that the acoustic transducer can be realized, which is capable of converting the sound wave into a plurality of electrical signals by outputting the plurality of electrical signals from the plurality of divided electrodes, respectively. Moreover, the plurality of variable capacitors are formed in the same vibrating membrane and fixed membrane. Accordingly, such effects are achieved that the variations among the chips with regard to the differences in detection sensitivity among the variable capacitors are suppressed, and that the mismatching in the chip with regard to the acoustic characteristics such as the frequency characteristics and the phase is suppressed.

As described above, in accordance with the acoustic transducer according to the present disclosure, the acoustic transducer capable of converting the sound wave into the plurality of electrical signals is realized in the same vibrating membrane and fixed membrane. Accordingly, since the variation of the acoustic characteristics can be suppressed, the acoustic transducer according to the present disclosure can be applied to an arbitrary MEMS-type acoustic sensor.

Figure 19:
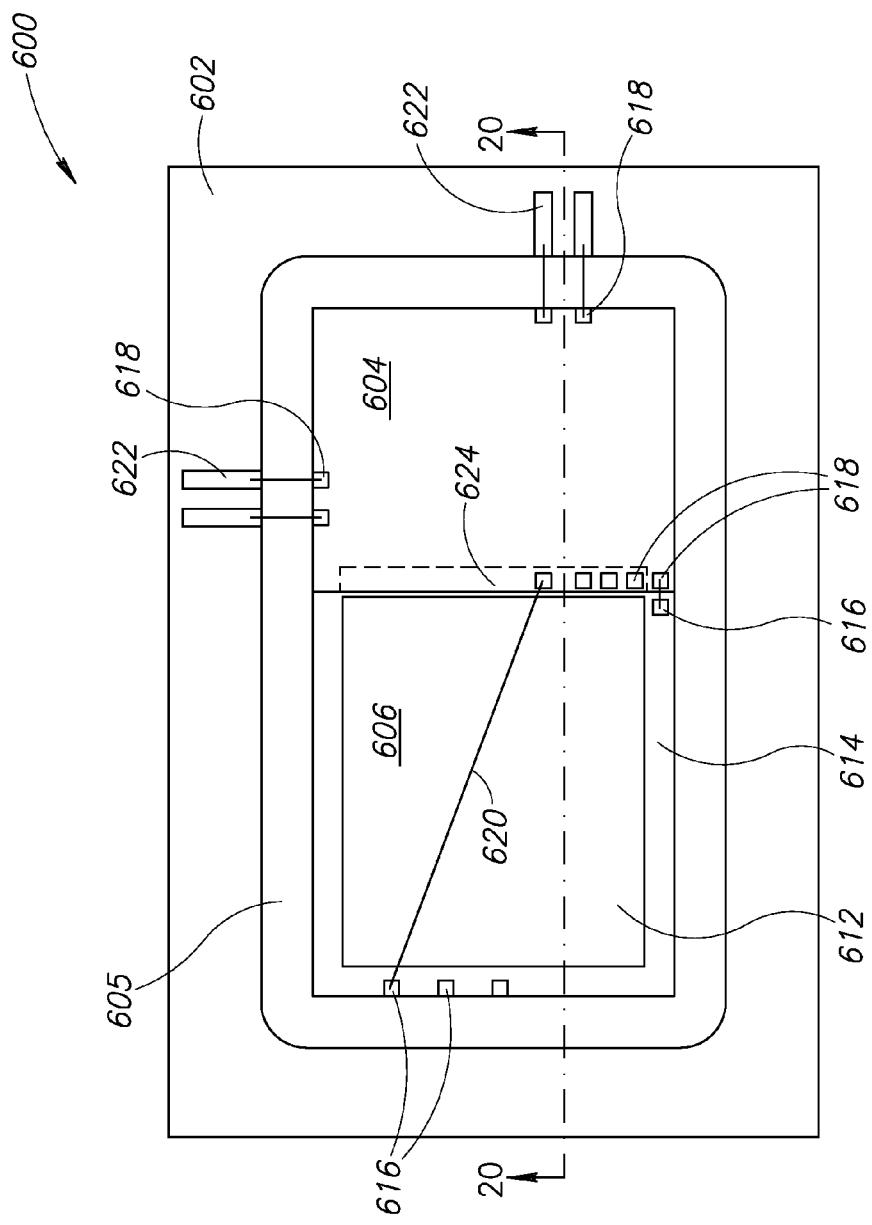
FIG. 19 is a top plan view of a package including an acoustic sensor of the present disclosure.
Figure 20:
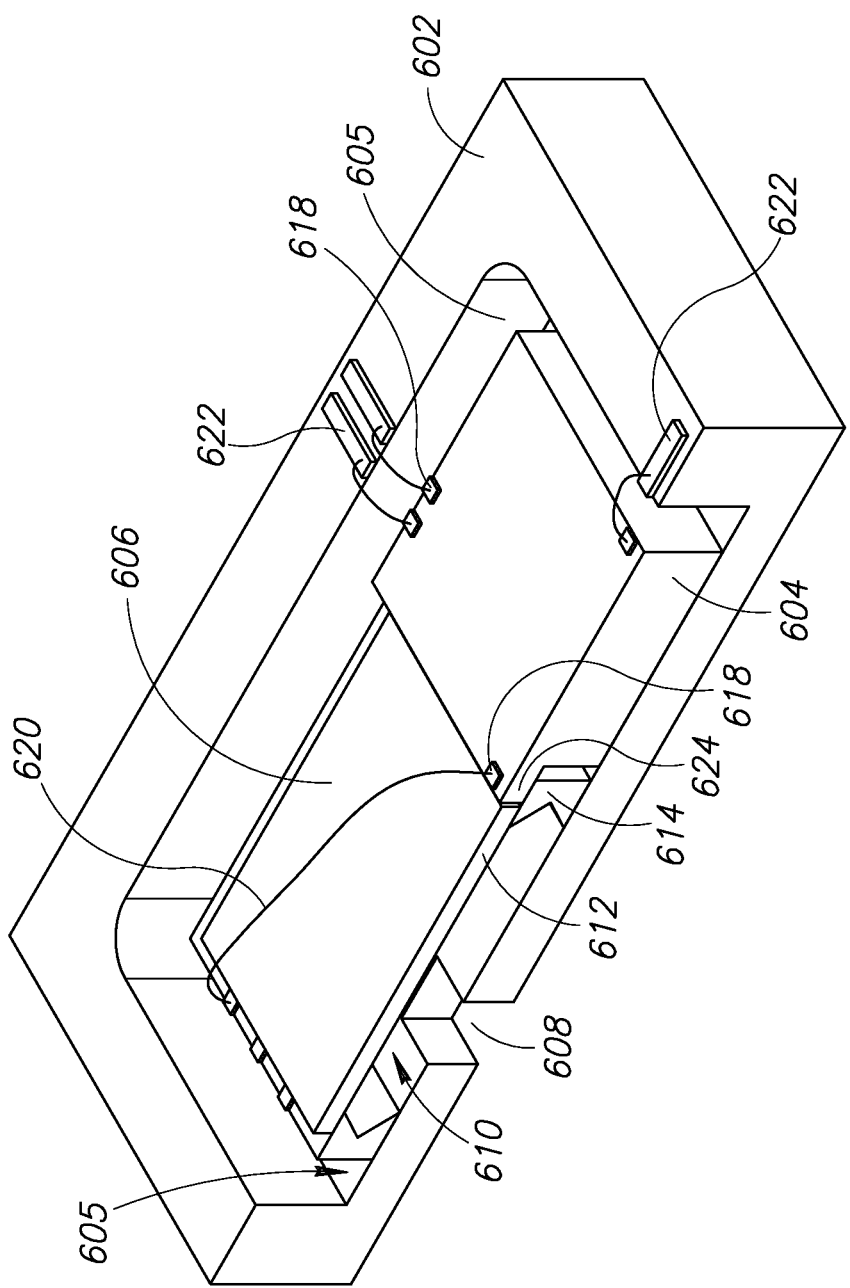
FIG. 20 is a cross-sectional view of the package of FIG. 19 taken through 20-20 of the present disclosure.

FIGS. 19 and 20 are a top down view of and a cross-sectional view through 20-20 of a package 600 formed in accordance with the present disclosure. The package 600 includes a housing 602 with an interior chamber 605. An ASIC 604 is adjacent to a MEMS die 606 in the chamber 605. The housing 602 includes an opening 608. The MEMS die 606 is a microphone and is positioned to cover the opening 608. The opening 608 is configured to allow sound waves to enter a back chamber 610 of the microphone such that a vibrating membrane, not shown, can detect the sound waves.

The microphone includes a protecting membrane 612 positioned on a substrate 614. Various contact pads 616 are formed on the substrate around edges of the protecting membrane. The ASIC 604 includes a plurality of contact pads 618 on a top surface. Some of the contact pads 616 are coupled to contact pads 618 by wires 620. Other contact pads 622 may be formed on a top surface of the housing 602. Others of the contact pads 618 of the ASIC are coupled to the contact pads 622 on the housing 602 and provide electrical connection to external components, such as a printed circuit board in a mobile phone.

The ASIC 604 includes an overhang 624 that overlaps and covers a part of the MEMS die 606. The shaped die for the ASIC 604 allows the die to be positioned more closely together while shortening the distance to couple the contact pads 618 on the ASIC with the contact pads 616 on the MEMS.

Figure 21:
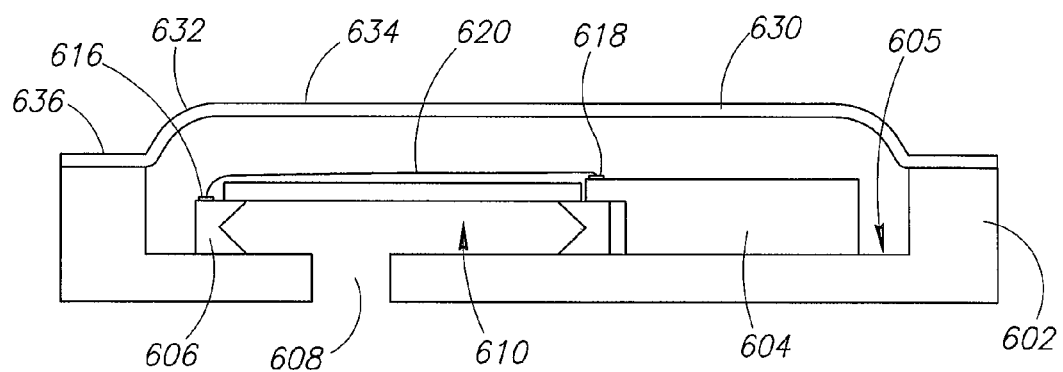
FIG. 21 is a cross-sectional view of the package of FIG. 19, including a cap of the present disclosure.

FIG. 21 is a front cross-sectional view of the housing 602 in FIG. 20 including a metal cap 630. The cap 630 has curved side portions 632 that connect a top portion 634 to side connection portions 636. The cap 630 forms a metal shielded cavity package once the cap is coupled and fixed to the housing by gluing or otherwise adhering the connection portions 636 to a top surface of the housing. The glue or adhesive may be conductive to achieve a ground connection.

Figure 22:
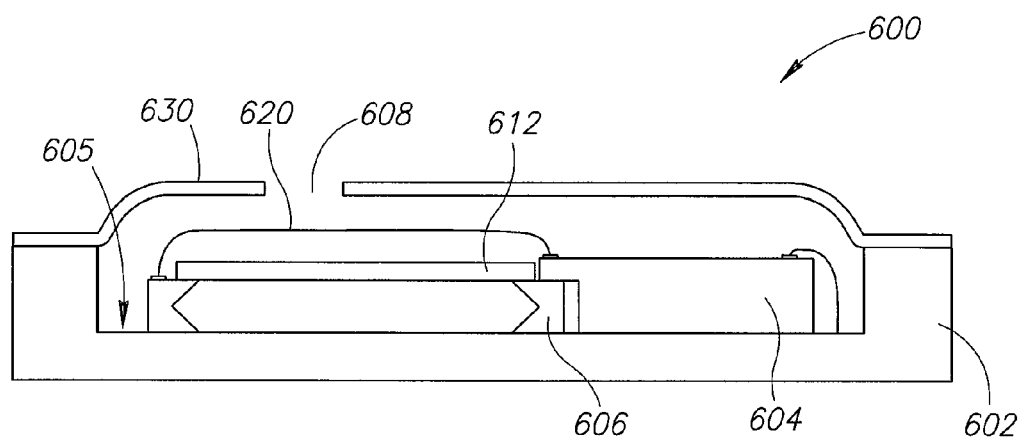
FIGS. 22-26 are alternative packages arrangements in accordance with the present disclosure.

FIGS. 22-28 are alternative arrangements of the MEMS die 606 and the ASIC 604 in the package 600. In FIG. 22, the housing 602 is solid and does not include the opening 608 described above; however, the MEMS die 606 and the ASIC 604 are positioned on the lower surface of the chamber 605 in the same arrangement as in FIGS. 19-22. Instead, the opening 608 is in the metal cap 630 positioned directly above the MEMS die 606. In this arrangement, sound waves will first pass through the protecting membrane 612, such as through sound holes, which are not shown in this view. The sound waves will then hit the vibrating membrane and be detected by the capacitors.

Figure 23:
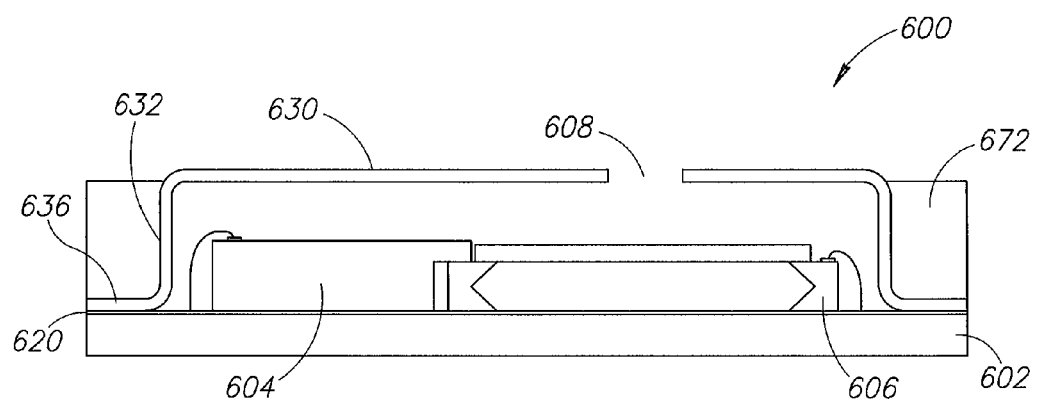

FIG. 23 is an alternative arrangement of the package 600 that includes a flat version of the housing 602, which is a planar substrate. An adhesion layer 670 is formed on the housing 602 prior to attaching the ASIC or the MEMS die. The cap 630 has longer side portions 632 such that the cap 630 rests on the flat housing instead of on the raised edges of the housing. The connection portions 636 adhere to or are otherwise bonded to the adhesion layer 670. The side portions 632 are covered by an encapsulant 672 that is formed only around the side portions of the metal cap 630. This over molding with encapsulating provides mechanical anchoring that reduces a likelihood of breaking the seal of the package. A top portion 634 of the cap remains exposed and the opening 608 is through this top portion.

Figure 24:
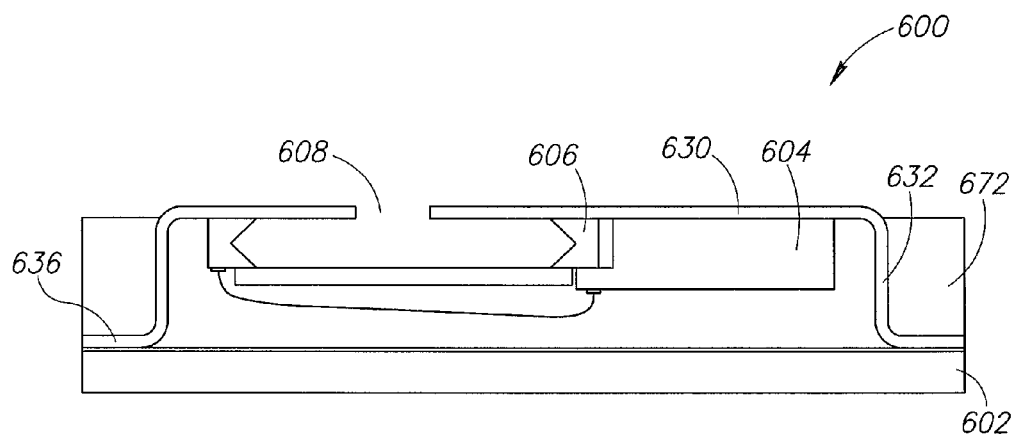

FIG. 24 is another alternative embodiment of the package. The package 600 is similar to the package in FIG. 23; however, the MEMS die 606 and the ASIC die are attached to the metal cap 630. The MEMS die 606 is positioned in line with the opening 608 in the metal cap 630. Although not shown, it is possible that the ASIC die be attached to the housing 602 while the MEMS die 606 is attached to the cap, or vice versa.

Figure 25:
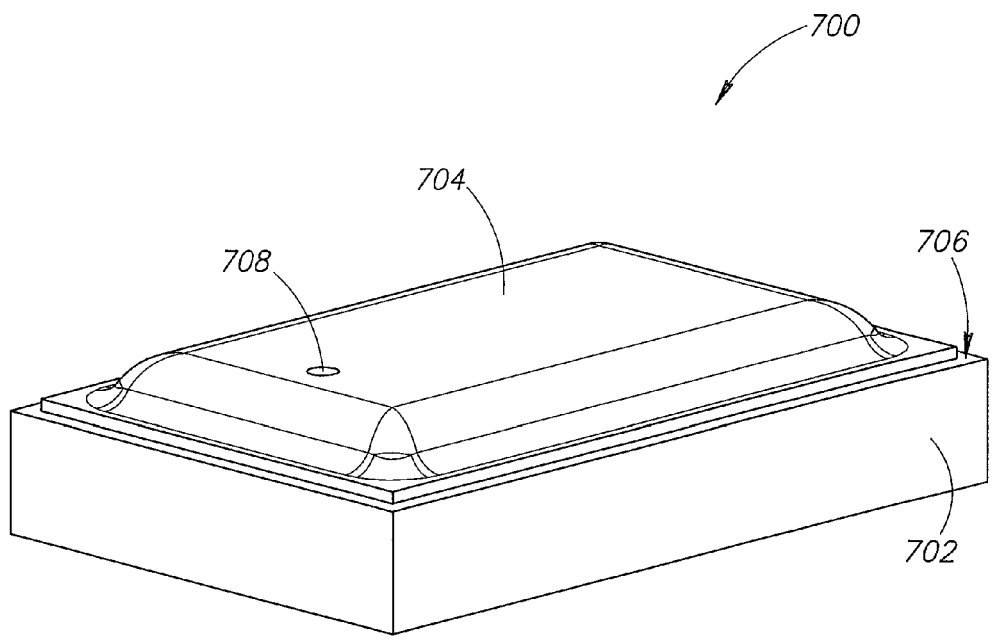
Figure 26:
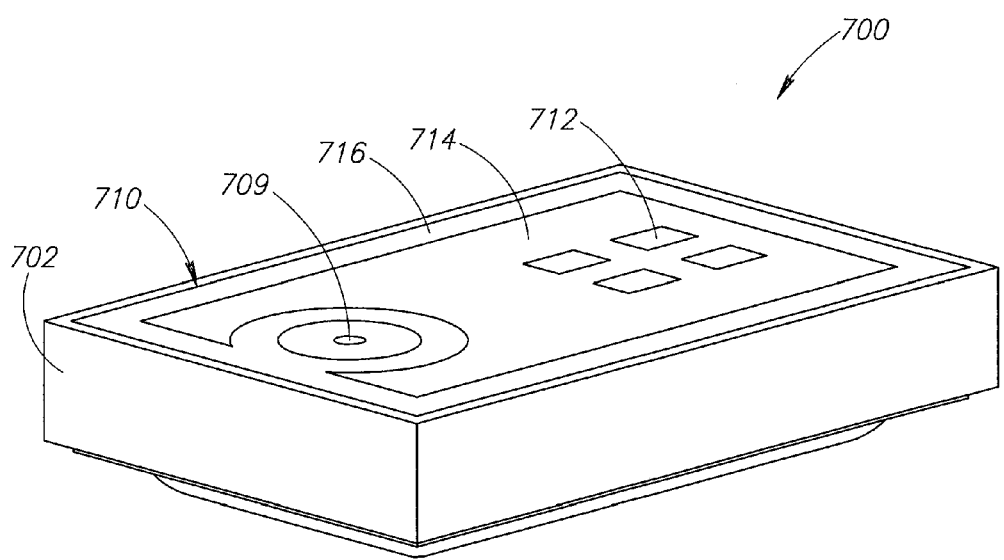

FIGS. 25 and 26 are top and bottom views of alternative embodiments of a package 700 formed in accordance with the present disclosure. The package 700 includes a housing 702, which may contain a cavity as discussed above with respect to FIG. 19 that includes a MEMS die and an ASIC die. The package 700 includes a cap 704 coupled to a top surface 706 of the housing 702.

In FIG. 25, an opening 708 is provided in the cap 704. In contrast, in FIG. 26, an opening 709 is provided in a bottom surface 710 of the housing. The opening is in either the cap or the housing.

In FIG. 26, the bottom surface 710 includes a plurality of contact pads 712 that are isolated from each other by an encapsulant 714 or other suitable dielectric. A conductive edge 716 that is adjacent to an outer edge of the package surrounds the opening 709.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An acoustic transducer, comprising:
   a substrate;
   a chamber in the substrate;
   a first electrode suspended above the chamber, the first electrode including:
     a first rectangular portion having a first area and including a plurality of first anchor regions;
     a second rectangular portion having a second area, the second area being smaller than the first area, the second rectangular portion extending from a first side of the first rectangular portion and the second rectangular portion being separated from the first rectangular portion by a first thin opening, the second area including second anchor regions, each second anchor region being greater in area than one of the first anchor regions, each second region being greater in area than one of the first anchor regions.

2. The acoustic transducer of claim 1 wherein the first rectangular portion includes a first length and a first width and the second rectangular portion includes a second length and a second width, the first width being greater than the second width.

3. The acoustic transducer of claim 1 wherein the first rectangular portion configured to move in response to changes in pressure with a first displacement and the second rectangular portion configured to move in response to the changes in pressure with a second displacement, the first displacement being greater than the second displacement.

4. An acoustic transducer, comprising:
   a substrate;
   a chamber in the substrate;
   a first electrode suspended above the chamber, the first electrode including:
     a first rectangular portion having a first area and including a plurality of first anchor regions;
     a second rectangular portion having a second area the second area being smaller than the first area, the second rectangular portion extending from a first side of the first rectangular portion and the second rectangular portion being separated from the first rectangular portion by a first thin opening, and including a second anchor region; and
   a third shared anchor region is coupled to the first rectangular portion and the second rectangular portion.

5. The acoustic transducer of claim 4 wherein the first rectangular portion includes a first length and a first width and the second rectangular portion includes a second length and a second width, the first width being greater than the second width.

6. The acoustic transducer of claim 4 wherein the second rectangular portion is completely separated from the first rectangular portion by the first thin opening.

7. An acoustic transducer, comprising:
a substrate;
a chamber in the substrate;
a first electrode suspended above the chamber, the first electrode including:
  a first rectangular portion having a first area and including a plurality of first anchor regions;
  a second rectangular portion having a second area the second area being smaller than the first area, the second rectangular portion extending from a first side of the first rectangular portion and the second rectangular portion being separated from the first rectangular portion by a first thin opening, and including a second anchor region; and
  a third shared anchor region is coupled to the first rectangular portion and the second rectangular portion, the first opening having curved ends, a first curved end being positioned adjacent to the third shared anchor region and a second curved end being positioned adjacent to one of the first anchor regions and the second anchor region.

8. The acoustic transducer of claim 7 wherein the first rectangular portion includes a first length and a first width and the second rectangular portion includes a second length and a second width, the first width being greater than the second width.

9. The acoustic transducer of claim 7 wherein the first electrode is a vibrating electrode.

10. An acoustic transducer, comprising:
a substrate;
a chamber in the substrate;
a first electrode suspended above the chamber, the first electrode including:
  a first rectangular portion having a first area;
  a second rectangular portion having a second area, the second area being smaller than the first area, the second rectangular portion extending from a first side of the first rectangular portion and the second rectangular portion being separated from the first rectangular portion by a first thin opening;
  a third rectangular portion having a third area, the third area being smaller than the first area, the third rectangular portion extending from a second side of the first rectangular portion and the third rectangular portion being completely separated from the first rectangular portion by a second thin opening.

11. The acoustic transducer of claim 10 wherein the first rectangular portion includes a first length and a first width and the third rectangular portion includes a second length and a second width, the first width being greater than the second width.

12. The acoustic transducer of claim 10 wherein the second rectangular portion is completely separated from the first rectangular portion by the first thin opening.

13. The acoustic transducer of claim 12 wherein the first electrode is a vibrating electrode, the first rectangular portion having a plurality of first anchors positioned at corner regions, the second rectangular portion having a plurality of second anchors positioned at ends of the second rectangular portion, the third rectangular portion having a plurality of third anchors positioned at ends of the third rectangular portion.

14. An acoustic transducer, comprising:
a substrate;
a chamber in the substrate;
a first electrode suspended above the chamber, the first electrode including:
  a first rectangular portion having a first area;
  a second rectangular portion having a second area, the second area being smaller than the first area, the second rectangular portion extending from a first side of the first rectangular portion; and
  a first thin opening separating the first rectangular portion from the second rectangular portion, the first thin opening having curved ends that are closer to the second rectangular portion than a central portion of the first opening.

15. The acoustic transducer of claim 14 wherein the first rectangular portion includes a first length and a first width and the second rectangular portion includes a second length and a second width, the first width being greater than the second width.

16. The acoustic transducer of claim 14 the first electrode is a vibrating electrode.

17. An acoustic transducer, comprising:
a substrate;
a chamber in the substrate;
a electrode suspended above the chamber, the electrode including:
  a first rectangular portion having a first area, the first rectangular portion configured to move in response to changes in pressure with a first displacement; and
  a second rectangular portion having a second area, the second area being smaller than the first area, the second rectangular portion extending from a first side of the first rectangular portion and the second rectangular portion being separated from the first rectangular portion by a first thin opening, the second rectangular portion configured to move in response to the changes in pressure with a second displacement, the first displacement being greater than the second displacement.

18. The acoustic transducer of claim 17 wherein the first rectangular portion includes a first length and a first width and the second rectangular portion includes a second length and a second width, the first width being greater than the second width.

19. The acoustic transducer of claim 17 the first electrode is a vibrating electrode.

* * * * *